United States Patent [19]
Nii et al.

[11] Patent Number: 5,933,719
[45] Date of Patent: Aug. 3, 1999

[54] METHOD OF MANUFACTURING A SEMICONDUCTOR DEVICE

[75] Inventors: Hideaki Nii, Kawasaki; Mizuki Ono, Yokohama, both of Japan

[73] Assignee: Kabushiki Kaisha Toshiba, Kawasaki, Japan

[21] Appl. No.: 08/816,036

[22] Filed: Mar. 11, 1997

[30] Foreign Application Priority Data

Mar. 14, 1996 [JP] Japan ................................. 8-057635
Feb. 5, 1997 [JP] Japan ................................. 9-022652

[51] Int. Cl.$^6$ ............................................. H01L 21/8238
[52] U.S. Cl. .......................... 438/202; 438/250; 438/393
[58] Field of Search ............................ 438/3, 238, 239, 438/240, 250, 253, 381, 393, 396, 202

[56] References Cited

U.S. PATENT DOCUMENTS 5,065,220 11/1991 Paterson et al. .
5,395,782 3/1995 Ohkoda et al. ........................ 438/234
5,591,663 1/1997 Nasu et al. .
5,670,808 9/1997 Nishihori et al. .

FOREIGN PATENT DOCUMENTS 5-234804 9/1993 Japan .
7-273297 10/1995 Japan .

*Primary Examiner*—Tuan H. Nguyen
*Attorney, Agent, or Firm*—Foley & Lardner

[57] ABSTRACT

The proposed semiconductor device can provide a capacitor having an excellent capacitance controllability thereof and a high reliability thereof. A method of manufacturing a semiconductor device comprises the steps of: forming a first insulating film on a semiconductor substrate on which a lower capacitor electrode has been formed; removing the first insulating film at a capacitor forming region on the lower capacitor electrode; forming a second insulating film on the semiconductor substrate; forming a conductive film on the formed second insulating film; patterning the conductive film and the second insulating film, to leave both the films at least at the capacitor forming region; patterning the first insulating film, to form a contact hole with the lower capacitor electrode at a region other than the capacitor forming region; and dry etching the lower capacitor electrode, to remove a natural oxide film formed at a bottom of the contact hole.

8 Claims, 29 Drawing Sheets

METHOD OF MANUFACTURING A SEMICONDUCTOR DEVICE

BACKGROUND OF THE INVENTION

1. Field of the Invention

The present invention relates to a semiconductor device having a capacitor and a method of manufacturing the same semiconductor device.

2. Description of the Prior Art

The manufacturing process of a conventional semiconductor device having a capacitor will be explained hereinbelow with reference to FIGS. 13A to 13C, FIGS. 14A to 14C and FIGS. 15A to 15C.

First, as shown in FIG. 13A, an element separating region 52 is formed on a semiconductor substrate 51 by LOCOS (Local Oxidization of Silicon), for instance. Further, as shown in FIG. 13B, a poly-crystal silicon film 53 having a film thickness of about 200 nm is formed on the element separating region 52 by LPCVD (Low-Pressure Chemical Vapor Deposition), and then the formed poly-crystal silicon film 53 is patterned by anisotropic etching method, for instance such as reactive ion etching (referred to as RIE, hereinafter). After that, as shown in FIG. 13C, a silicon oxide film 55 having a film thickness of about 500 nm is deposited on the substrate as an interlayer insulating film by CVD (Chemical Vapor deposition) method, for instance.

Further, as shown in FIG. 14A, the silicon oxide film 55 formed at a capacitor forming region is removed to open a hole 57 by the RIE method, for instance. After that, as shown in FIG. 14B, a silicon nitride film 59 having a film thickness of about 50 nm is deposited all over the substrate as a capacitor insulating film. Successively, as shown in FIG. 14C, the silicon nitride film 59 is removed from the area other than the capacitor forming region.

Further, as shown in FIG. 15A, a contact hole 63 is opened in the silicon oxide film 55 by the RIE method. Successively, as shown in FIG. 15B, an Al wiring film 61 containing silicon of 1at % (for instance) is deposited by sputtering, for instance. Further, as shown in FIG. 15C, two wiring portions 61a and 61b are formed by patterning the Al wiring film 61, and then sintered within a forming gas atmosphere at 450° C. After that, a silicon oxide film (not shown) having a film thickness of about 1000 nm, for instance is formed on the surface of the substrate as a passivation film.

Here, the component of the forming gas is hydrogen diluted by nitrogen, and the hydrogen concentration thereof is about 10 to 30%. The substrate is sintered for two objects as follows: One is to improve the electrical contact between the wire (Al or barrier metal) and the underground silicon, and the other is to terminate an excessive potential level in the interface between the gate insulating film and the silicon.

In the conventional semiconductor device as described above, however, the Al wiring film 61 is formed by the sputtering on condition that the capacitor insulating film 59 is left exposed. In this case, prior to the sputtering, when Ar ions are sputtered (referred to as sputtering, hereinafter) in order to remove a natural oxide film formed on the bottom of the contact hole 63, since the capacitor insulating film 59 is also exposed for the sputtering, the insulating film 59 is inevitably cut down, so that there exists a problem in that the controllability of the capacitance of the capacitor deteriorates.

In addition, although not shown in the above-mentioned conventional semiconductor device, when tungsten, for instance is electively grown to bury the contact hole 63, since the tungsten is grown in the same way when the capacitor insulating film is left exposed, tungsten is inevitably grown on the capacitor insulating film. Further, when the excessive tungsten is peeled off by sputtering, since the capacitor insulating film is exposed to etching, there exists a problem in that the film thickness also disperses.

The manufacturing process of a conventional analog LSI used for mobil communications will be explained hereinebelow with reference to FIGS. 26A to 26C, FIGS. 27A to 27C, FIGS. 28A to 28C, and FIGS. 29A and 29B. Here, this analog LSI is formed with a bipolar transistor, a MOS type field effect transistor (referred to as MOSFET, hereinafter), and a capacitor.

First, as shown in FIG. 26A, after an oxide film 172 has been formed on a silicon substrate 171 by thermal oxidization, the formed oxide film 172 is patterned by etching with the use of photolithography and HF based solution, to remove the oxide film 172 from a region where a buried layer is to be formed. Successively, after a glass layer 173 containing Sb has been formed all over the surface of the silicon substrate 171, Sb is diffused in the silicon substrate by thermal process, to form an N⁺ buried layer 174.

Further, as shown in FIG. 26B, after the glass layer 173 has been removed and further the oxide film 172 has been peeled off by use of the HF based solution, a monocrystal silicon layer 175 containing phosphorous of $3.0\times10^{16}$ cm$^{-3}$ is formed all over the substrate by epitaxial growth method.

Successively, as shown in FIG. 26C, after the substrate surface has been oxidized to form an oxide film 176 having a film thickness of about 500 Å, a poly-crystal silicon layer 177 having a film thickness of about 1000 Å and a silicon nitride film 178 having a film thickness of about 1500 Å are both deposited in sequence. Further, the silicon nitride film 178 and the poly-crystal silicon film 177 are both removed, by use of the photolithography and the RIE (Reactive-Ion Etching), from the regions where element separating regions are to be formed.

Successively, as shown in FIG. 27A, an element separating oxide film 179 is formed on the regions from which the silicon nitride film 178 and the poly-crystal silicon film 177 have been already removed. Successively, the silicon nitride film 178 and the poly-crystal silicon film 177 remaining on the substrate are both removed by CDE (Chemical Dry Etching) method.

Further, as shown in FIG. 27B, a P well 180 and an N well 181 are formed at regions where the MOSFET is to be formed by use of the photolithography and ion implanting technique. Successively, channels are formed by ion implantation. Further, after a oxide film 176 formed on the element region has been removed, a gate oxide film 184 is formed by the thermal oxidization. Further, a poly-crystal silicon having a film thickness of about 3000 Å has been deposited all over the substrate surface, the substrate is patterned to form a gate electrode 185. After that, an N-type diffusion layer 182 and a P-type diffusion layer 183 are formed by the photolithography and the ion implantation technique.

Further, as shown in FIG. 27C, after a silicon oxide film 188 having a film thickness of about 3000 Å has been deposited all over the substrate surface by the LPCVD method, the silicon oxide film 188 formed on the region where a bipolar transistor is to be formed is removed by patterning with the use of the photolithography and the wet etching of HF based solution, to expose the monocrystal silicon layer 175 and the element separating oxide film 179 formed on the silicon substrate 171.

Further, as shown in FIG. 28A, the monocrystal silicon layer 190a or 190b containing P-type impurities (e.g., boron) is formed on the exposed monocrystal silicon layer 175 by use of the selective epitaxial technique. After that, a silicon oxide film is deposited all over the substrate surface, to form an etching stopper film 192 remaining on the region where a base region is to be formed by patterning this silicon oxide film.

Further, as shown in FIG. 28B, a poly-crystal silicon film has been deposited all over the substrate surface, a base leading electrode 194a and a collector leading electrode 194b are formed by patterning. Further, the P-type impurities are implanted at the base leading electrode 194a and the N-type impurities are implanted at the collector leading electrode 194b, respectively. In this process, since the N-type impurities are implanted in the P-type monocrystal silicon layer 190b formed under the collector leading electrode 194b, the P-type monocrystal silicon layer 190b is reversed into the N-type. After that, a silicon nitride film 196 is deposited on the bipolar transistor forming region by use of the CVD (Chemical Vapor Deposition). Successively, the silicon nitride film 196 and the poly-crystal silicon film 194a formed on the etching stopper film 192 are both removed by use of the RIE method, to form a hole 197 for forming an emitter region.

Successively, as shown in FIG. 28C, a nitride film is deposited all over the substrate surface by use of the CVD method, and a side wall 198 is formed on a side surface of the hole 197 by the RIE. Further, the etching stopper film 192 is etched by use of the wet etching with the formed side wall 198 as a mask, to expose the monocrystal silicon layer 190a, without damaging the monocrystal silicon layer 190a used as the base region. Further, after the poly-crystal silicon layer has been deposited all over the substrate surface, N-type impurities have been implanted in the poly-crystal silicon layer, and further an emitter region 202 is formed in the base region 190a by thermal process. After that, the poly-crystal silicon layer containing N-type impurities is patterned to form an emitter electrode 200 at the bipolar transistor region and a lower capacitor electrode 201 at the MOSFET forming region.

Further, as shown in FIG. 29A, a silicon oxide film having a film thickness of about 8000 Å is deposited all over the substrate surface by use of the LPCVD method, to form an interlayer insulating film 209 to be formed under a first-layer Al wire. Further, after a hole has been opened in the interlayer insulating film 209 formed on the lower capacitor electrode 201, a silicon nitride film has been deposited and further the deposited silicon nitride film is patterned, to form a dielectric insulating film 210.

Further, as shown in FIG. 29B, after various contact holes for the respective electrodes of the bipolar transistor, the MOSFET and the lower capacitor electrode 201 have been opened in the interlayer insulating film 209, a natural oxide film formed at the bottoms of the contact holes is removed by use of the HF based solution. Further, after that, a barrier metal layer formed of Ti/TiN for instance has been deposited at the bottoms of the contact holes by use of the sputtering in order to prevent Al from being diffused to the silicon substrate, a metal wire layer formed of Al—Si—Cu alloy, for instance is deposited by use of the sputtering method. Further, the substrate is patterned to form the respective wires 214 connected to the respective electrodes of the bipolar transistor and the MOSFET and the lower capacitor electrode 201. In addition, an upper capacitor electrode 115 is also formed, with the result that a desired circuit can be completed.

The conventional circuit formed as described above can be used as the analog LSI of high performance. Here, however, there exist the following problems.

In order to further improve the performance, the case will be considered where the poly silicon electrodes (the emitter electrode 200, the base leading electrode 194a, and the collector leading electrode 194b) of the bipolar transistor, the poly silicon electrode (the gate electrode 185) of the MOSFET and the lower capacitor electrode 201 are all silicided into metals, respectively. In this case, since the silicide (e.g., $TiSi_2$, CoSi, etc.) is soluble in the HF based solution used for the ordinary LSI process, it is impossible to use the HF based solution when the natural oxide film formed on the silicide at the bottoms of the contact holes are required to be removed. To remove the natural oxide film formed on the silicide, it is necessary to use the dry etching such as Ar sputtering. In this case, however, when the natural oxide film formed on the silicide is being removed by the Ar sputtering, the dielectric insulating film 210 for constructing the capacitor is also inevitably cut down. As a result, there exists a problem in that the controllability of the capacitance of the capacitor is degraded, and thereby the reliability of the capacitor deteriorates markedly.

This has been clarified on the basis of the TDDB (Time Depend Dielectric Breakdown) test results obtained by the inventors. In this TDDB test, a plurality of capacitors each having a dielectric film formed of silicon nitride and a film thickness of about 500 Å (which has been further sputtered by Ar) are prepared. Further, the times until the capacitors are broken down are measured, on condition that the high voltages (e.g., three voltages of 32.5 V, 35 V, 37.5 V) are applied to these capacitors. FIG. 30 shows the test results, in which the breakdown time is expressed on the abscissa in logarithmic scale and the Weibull values are shown on the ordinate. Here, the Weibull values can be obtained on the basis of the survival probability of the sample population. Further, the Weibull values are so selected as to satisfy the linear relationship with respect to the logarithmic values of the breakdown times of the respective samples, as far as the sample population is normal. FIG. 30 indicates that the gradients of the Weibull lines at the respective voltages are different from each other and thereby the Weibull lines cross each other. This indicates that the capacitor reliability deteriorates.

SUMMARY OF THE INVENTION

With these problems in mind, therefore, it is the object of the present invention to provide a semiconductor device having a capacitor of excellent capacitance controllability and a method of manufacturing the same semiconductor device.

To achieve the above-mentioned object, a first aspect of the present invention provides a method of manufacturing a semiconductor device, comprising the steps of: forming a first insulating film on a semiconductor substrate on which a lower capacitor electrode has been formed; removing the first insulating film at a capacitor forming region on the lower capacitor electrode; forming a second insulating film on the semiconductor substrate; forming a conductive film on the formed second insulating film; patterning the conductive film and the second insulating film, to leave both the films at least at the capacitor forming region; patterning the first insulating film, to form a contact hole with the lower capacitor electrode at a region other than the capacitor forming region; and dry etching the lower capacitor electrode, to remove a natural oxide film formed at a bottom of the contact hole.

Further, a second aspect of the present invention provides a method of manufacturing a semiconductor device, comprising the steps of: forming a first insulating film on a semiconductor substrate on which a lower capacitor electrode has been formed; forming a conductive film on the formed first insulating film; patterning the conductive film and the first insulating film, to leave both the films at a capacitor forming region on the lower capacitor electrode; forming a second insulating film all over the semiconductor substrate; patterning the second insulating film, to form a contact hole with the lower capacitor electrode and a contact hole with the conductive film; and dry etching the lower capacitor electrode, to remove a natural oxide film formed at bottoms of the formed contact hole.

Further, a third aspect of the present invention provides a semiconductor device, comprising: a lower capacitor electrode formed on a semiconductor substrate; a first insulating film formed for covering said lower capacitor electrode; a hole opened in said first insulating film so as to expose a capacitor forming region; a second insulating film formed at a bottom of said hole; a conductive film formed on said second insulating film; and a leading electrode for said lower capacitor electrode, formed through said first insulating film at a region other than the capacitor forming region on said lower capacitor electrode; and wherein: Ar or Cl is contained in a surface region of the lower capacitor electrode connecting with said leading electrode; and a concentration profile thereof has a peak at a point internally away from an outermost surface of the lower capacitor electrode.

As described above, in the method of manufacturing the semiconductor device according to the present invention, since the conductive film remains on the second insulating film at the capacitor forming region, even if the sputtering is made prior to the sputtering for forming the leading electrode of the lower capacitor electrode, it is possible to obtain the capacitor of an excellent capacitance controllability.

DETAILED DESCRIPTION OF THE PREFERRED EMBODIMENTS

First Embodiment

The first embodiment of the method of manufacturing the semiconductor device according to the present invention will be described hereinbelow with reference to FIGS. 1A to 1C, FIGS. 2A to 2C, FIGS. 3A to 3C, and FIGS. 4A and 4B.

Figure 1A:
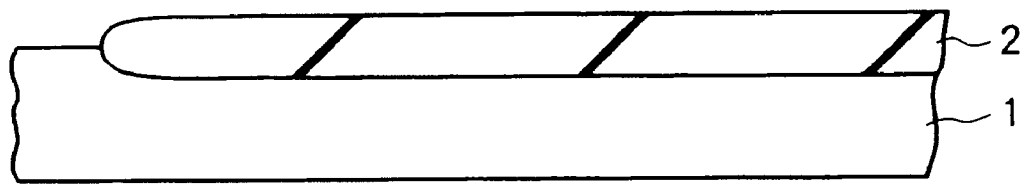
FIGS. 1A to 1C, FIGS. 2A to 2C, FIGS. 3A to 3C, and FIGS. 4A and 4B are cross-sectional views for assistance in explaining a first embodiment of the method of manufacturing the semiconductor device according to the present invention.
Figure 1B:
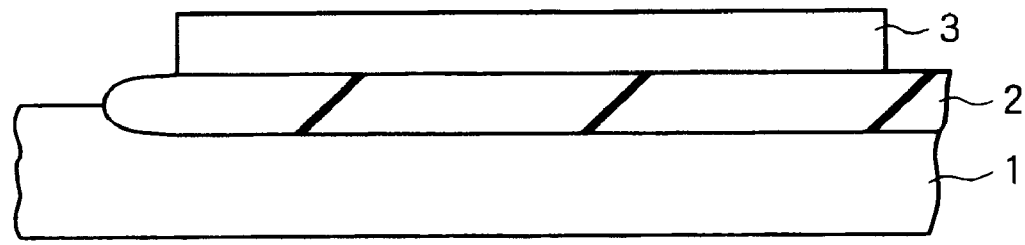

First, as shown in FIG. 1A, an element separating region 2 is formed on a semiconductor substrate 1 by the LOCOS (Local Oxidization of Silicon), for instance. Further, as shown in FIG. 1B, after a poly-crystal silicon film 3 having a film thickness of about 200 nm has been formed on the element separating region 2 by the LPCVD (Low-Pressure Chemical Vapor Deposition), a resist pattern (not shown) is formed on the formed poly-crystal silicon film 3. Further, the poly-crystal silicon film 3 is etched with the formed resist pattern as a mask by use of the anisotropic etching for instance such as the RIE (reactive ion etching), to left the poly-crystal silicon film 3 only at the element separating region 2.

Figure 1C:
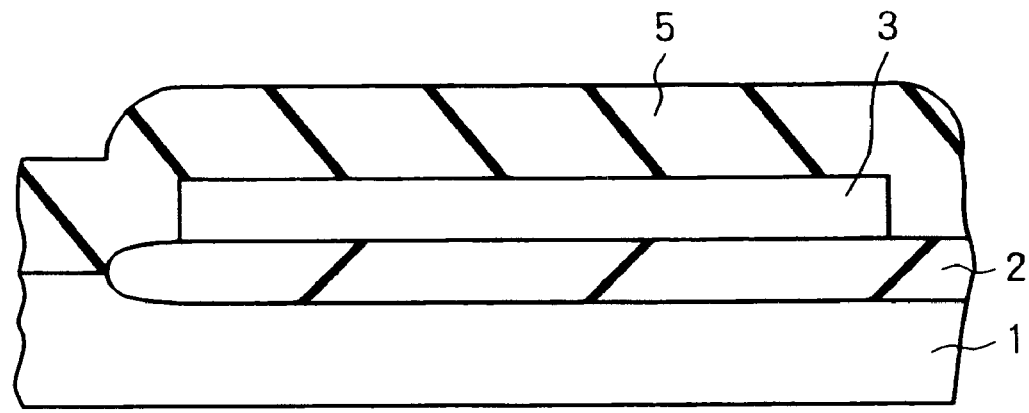

Further as shown in FIG. 1C, after the resist pattern has been removed, a silicon oxide film 5 having a film thickness of about 500 nm is deposited all over the substrate 1 as an interlayer insulating film by the CVD (Chemical Vapor deposition) method.

Figure 2A:
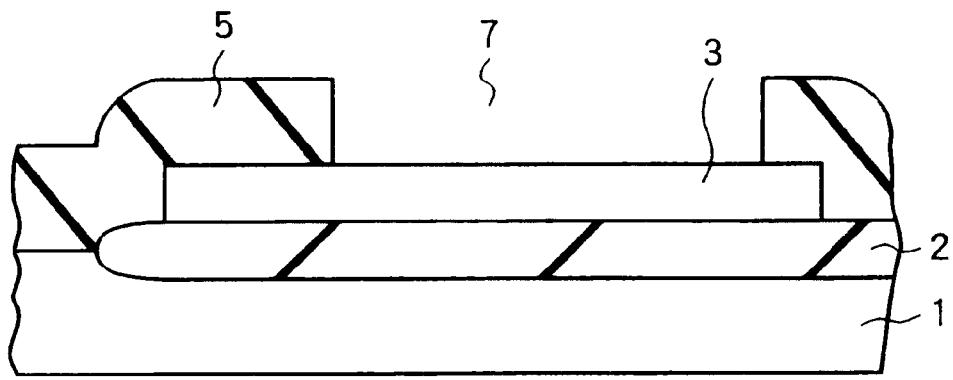
Figure 2B:
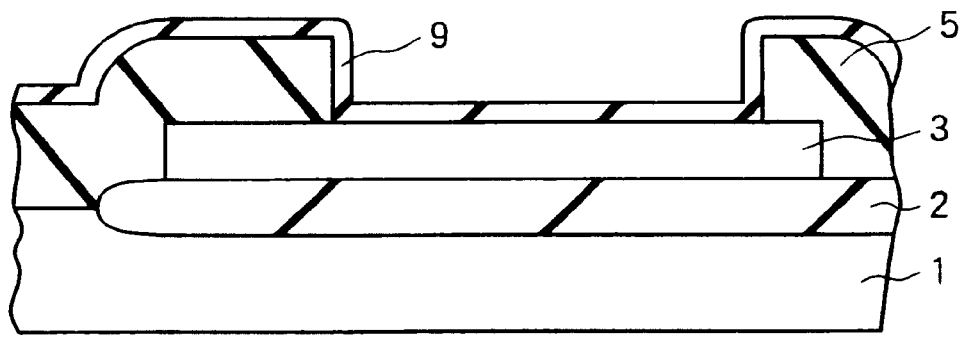
Figure 2C:
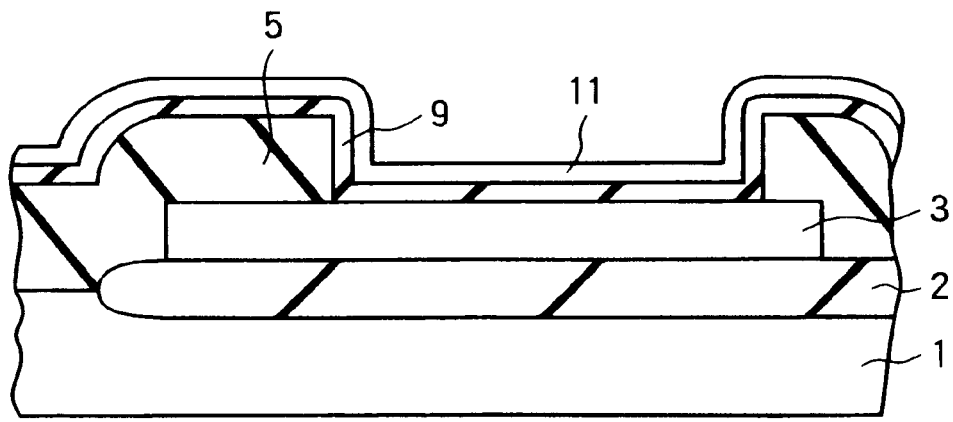

Further, as shown in FIG. 2A, after a resist pattern (not shown) has been formed on the silicon oxide film 5, a hole 7 is formed on the poly-crystal silicon film 3 by etching the silicon oxide film 5 by the RIE method with the formed resist pattern as a mask. Successively, as shown in FIG. 2B, after the resist pattern has been removed, a silicon nitride film 9 having a film thickness of about 50 nm, for instance is deposited all over the substrate 1 as a capacitance insulating film. Further, as shown in FIG. 2C, an Al film 11 having a film thickness of about 100 nm is formed on the silicon nitride film 9 by the sputtering method.

Figure 3A:
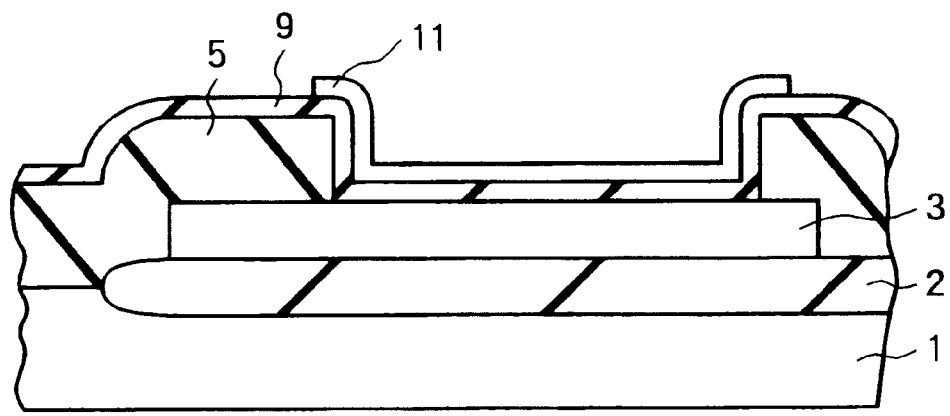
Figure 3B:
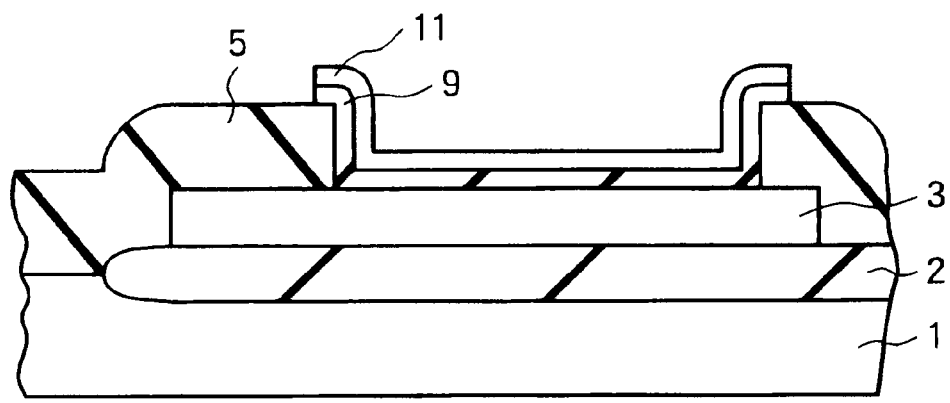
Figure 3C:
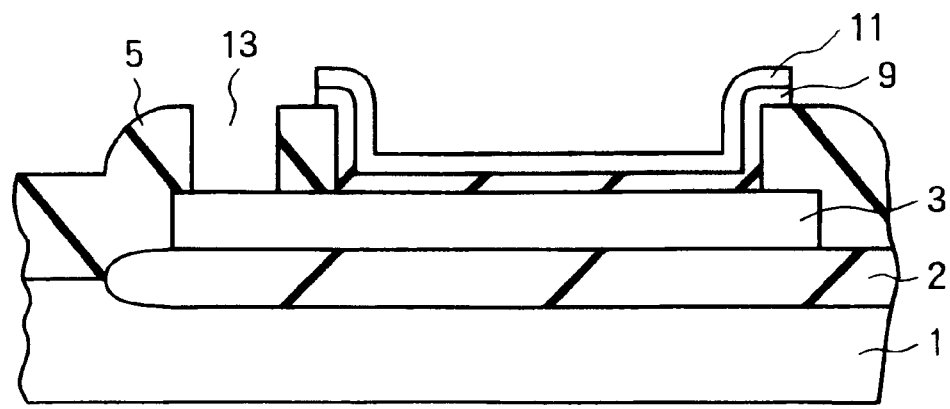

Further, as shown in FIG. 3A, a resist pattern (not shown) is formed on the Al film 11. After that, the Al film 11 is left only at a capacitance forming region by etching the Al film 11 (e.g., by the RIE method) with the resist pattern as a mask. Further, as shown in FIG. 3B, the silicon nitride film 9 is left only at the capacitance forming region by etching the silicon nitride film 9 (e.g., by the RIE method) with the resist pattern or the Al film 11 as a mask. Further, as shown in FIG. 3C, after a resist pattern (not shown) has been formed on the silicon oxide film 5, a hole 13 (as a contact hole) is formed at a region other than the capacitance forming region on the poly-crystal silicon film 3 by etching the silicon oxide film 5 (e.g., by the RIE method) with the resist pattern as a mask.

Figure 4A:
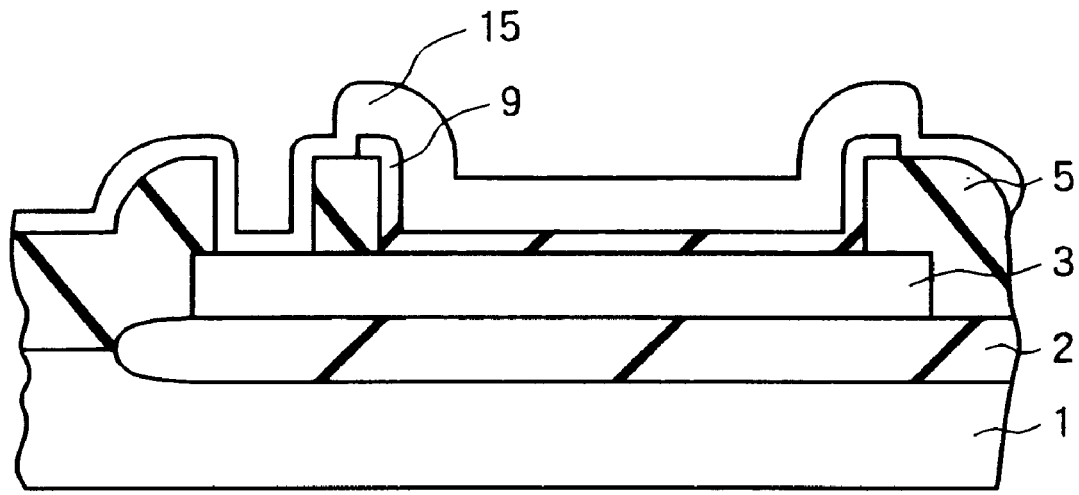
Figure 4B:
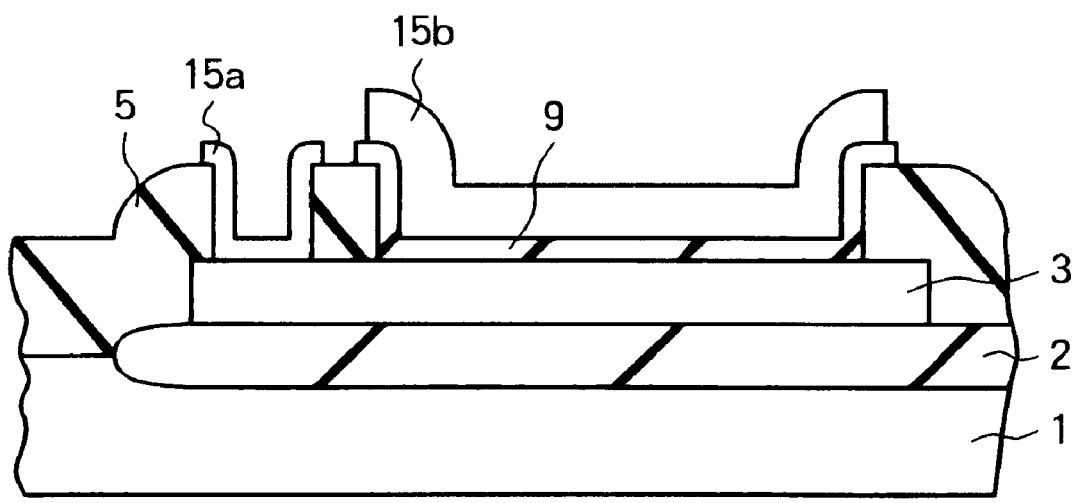

Further, as shown in FIG. 4A, after the resist pattern has been removed and further the natural oxide film formed at the bottom portion of the contact hole 13 has been removed by the sputtering of Ar ions, an Al film 15 containing silicon of 1 at %, for instance is deposited on the substrate by the sputtering method. Here, in FIG. 4A, the Al film is shown in together with the Al film 15. Further, as shown in FIG. 4B, after a resist pattern (not shown) has been formed on the Al film 15, lower and upper capacitance electrodes 15a and 15b are formed by etching the Al film 15 (e.g., by the RIE method) with the resist pattern as a mask. Further, after the substrate has been sintered within a forming gas atmosphere at 450° C., for instance, a silicon oxide film (not shown) having a film thickness of about 1000 nm is formed on the surface of the substrate 1 as a passivation film.

As described above, in the first embodiment of the semiconductor device manufacturing method according to the present invention, when the Al film 15 is being formed by the sputtering, since the capacitance forming region is covered with the Al film 11 (shown together with the Al film 11 in FIG. 4A), the capacitance insulating film 9 is not cut down by the sputtering (prior to the sputtering), so that it is possible to obtain an excellent controllability and the reliability of the capacitance of the capacitor formed between the lower and upper capacitor electrodes 15a and 15b.

Further, in this first embodiment, although the poly-crystal silicon film 3 used as the lower capacitor electrode is not silicided, even if this film 3 is silicided, it is of course possible to obtain the same effect with respect to the controllability of the thickness of the insulating film 9 of the capacitor. Further, even if a metal, a silicide or a laminate structure of both is adopted as the lower capacitance electrode, it is of course possible to obtain the same effect with respect to the controllability of the thickness of the insulating film of the capacitor. In addition, even if the Al film 11 deposited on the silicon nitride film in order to protect the capacitance insulating film 9 is replaced with another metal, semiconductor, metal silicide, or a laminate structure of these, it is of course possible to obtain the same effect as above.

Further, in the present embodiment, although the silicon nitride film is used as the insulating film 9 of the capacitor, even if the other insulating film such as silicon oxide, silicon nitride, a laminate film of silicon nitride and silicon oxide, etc. is used, it is of course possible to obtain the same effect with respect to the controllability of the thickness of the insulating film of the capacitor.

Further, in this embodiment, although the insulating film for forming the capacitor insulating film 9 is removed except at the capacitor forming region, even if this insulating film is kept remaining at the area other than the capacitor forming region, it is of course possible to obtain the same effect with respect to the controllability of the thickness of the insulating film of the capacitor.

Second Embodiment

Figure 5A:
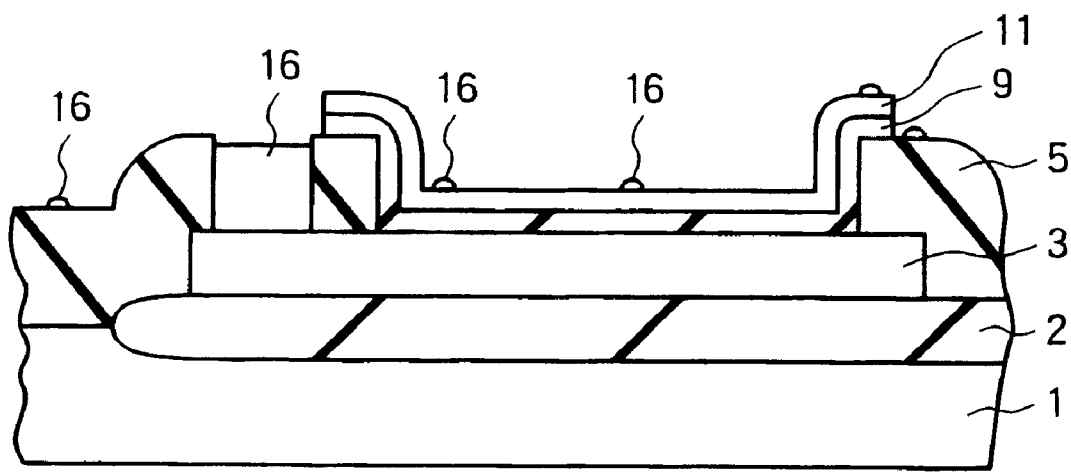
FIGS. 5A and 5B are cross-sectional views for assistance in explaining a second embodiment of the method of manufacturing the semiconductor device according to the present invention.

The second embodiment of the method of manufacturing the semiconductor device according to the present invention will be described hereinbelow with reference to FIGS. 5A and 5B.

The process of forming the contact hole 13 with the poly-crystal silicon film 3 formed as the lower capacitor electrode; that is, the process to the step shown in FIG. 3C is the same as with the case of the first embodiment. After that, as shown in FIG. 5A, the natural oxide film is removed by the sputtering of Ar gas, and tungsten 16 is buried in the contact hole 13 by use of the selective chemical vapor phase epitaxy method.

Figure 5B:
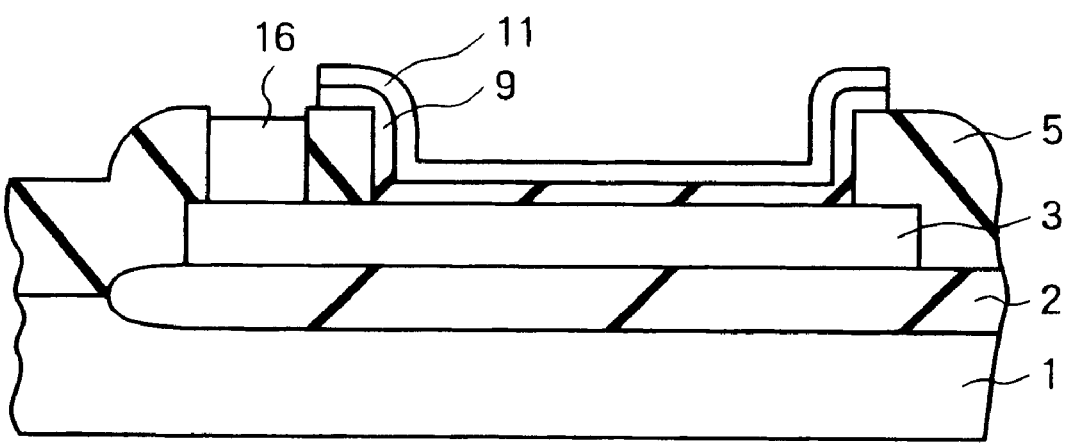

Further, as shown in FIG. 5B, after a resist has been applied all over the substrate 1, excessive tungsten produced by the preceding step is removed by the RIE method within a mixed gas atmosphere of $SF_6$ and $O_2$ (1:2) under pressure of 50 mTorr and at temperature of 60° C.

After that, the semiconductor device is completed by processing the device by the steps after that shown in FIG. 4A, in the same way as with the case of the first embodiment.

The second embodiment can of course provide the same effect as with the case of the first embodiment.

Third Embodiment

The third embodiment of the method of manufacturing the semiconductor device according to the present invention will be described hereinbelow with reference to FIGS. 6A to 6C, FIGS. 7A to 7C, FIGS. 8A to 8C and FIG. 9.

Figure 6A:
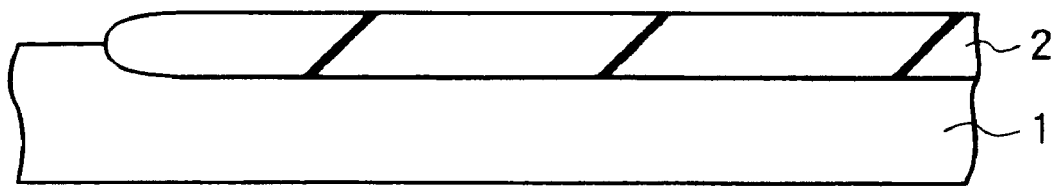
FIGS. 6A to 6C, FIGS. 7A to 7C, FIGS. 8A to 8C, and FIG. 9 are cross-sectional views for assistance in explaining a third embodiment of the method of manufacturing the semiconductor device according to the present invention.
Figure 6B:
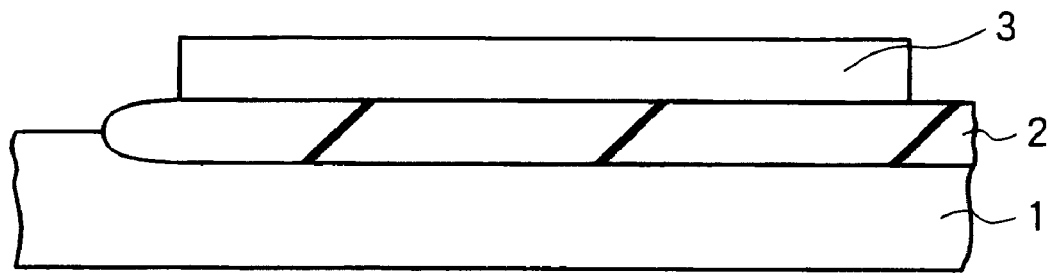
Figure 6C:
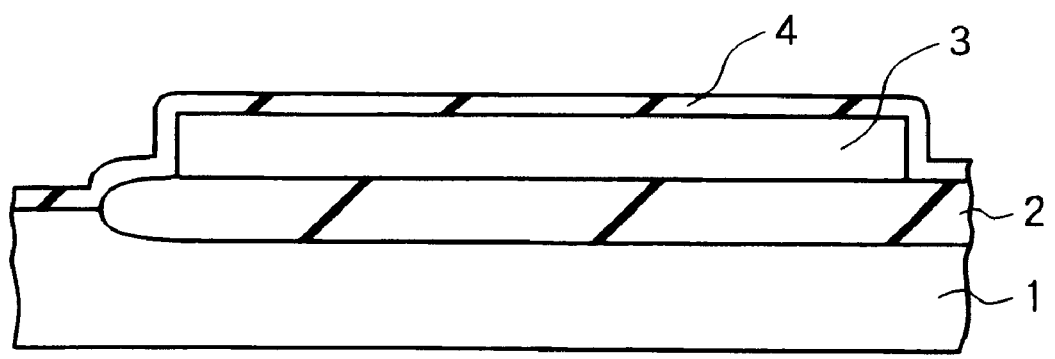

First, as shown in FIG. 6A, the element separating region 2 is formed the a semiconductor substrate 1 by the LOCOS, for instance. Further, as shown in FIG. 6B, the poly-crystal silicon film 3 having a film thickness of about 200 nm is deposited all over the surface of the substrate 1 by the LPCVD, for instance. Further, the formed poly-crystal silicon 3 is patterned by the RIE method to left the film 3 at a predetermined region of the element separating region 2. Further, as shown in FIG. 6C, a silicon nitride film 4 having a film thickness of about 50 nm is deposited all over the surface of the substrate 1 as a capacitor insulating film.

Figure 7A:
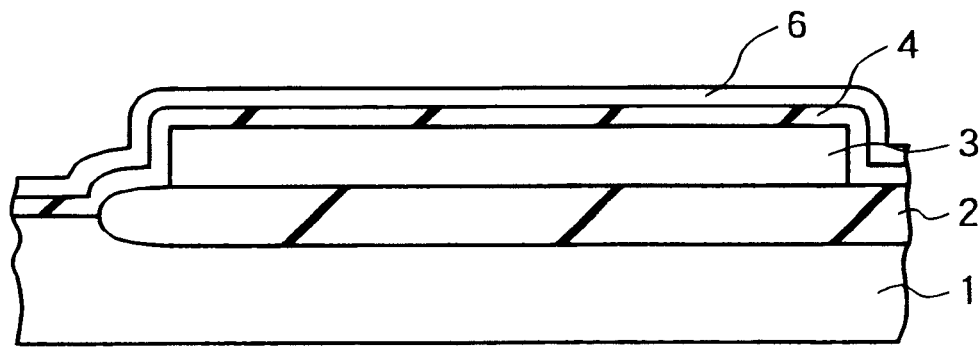
Figure 7B:
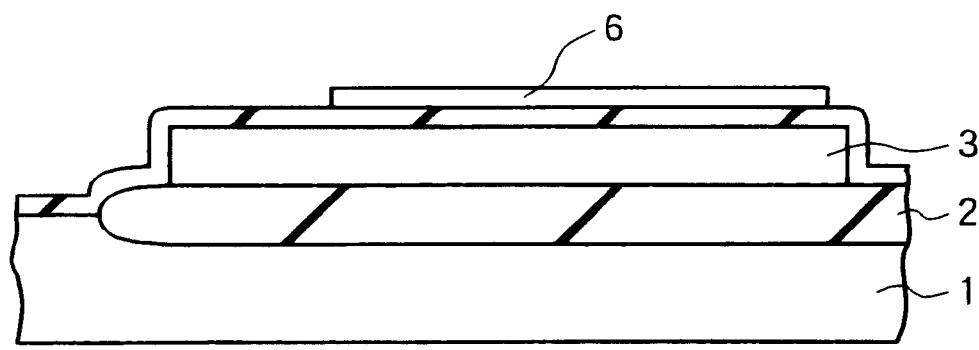
Figure 7C:
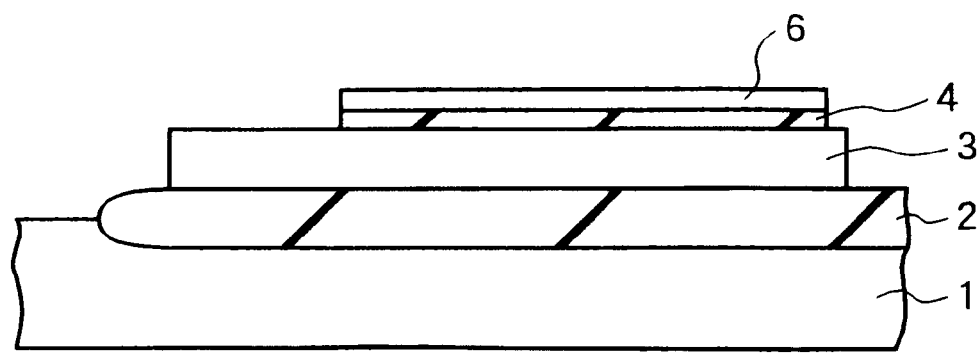

Further, as shown in FIG. 7A, an Al film 6 having a film thickness of about 100 nm, for instance is deposited on the silicon nitride film 4. Successively, a resist pattern (not shown) is formed on the Al film 6. Further, as shown in FIG. 7B, the formed Al film 6 is left only at the capacitor forming region by patterning the Al film 6 by the RIE method with the resist pattern as a mask. Further, as shown in FIG. 7C, the silicon nitride film 4 is left only at the capacitor forming region by the RIE method with the resist pattern or the Al film 6 as a mask. After that, the resist pattern is removed.

Figure 8A:
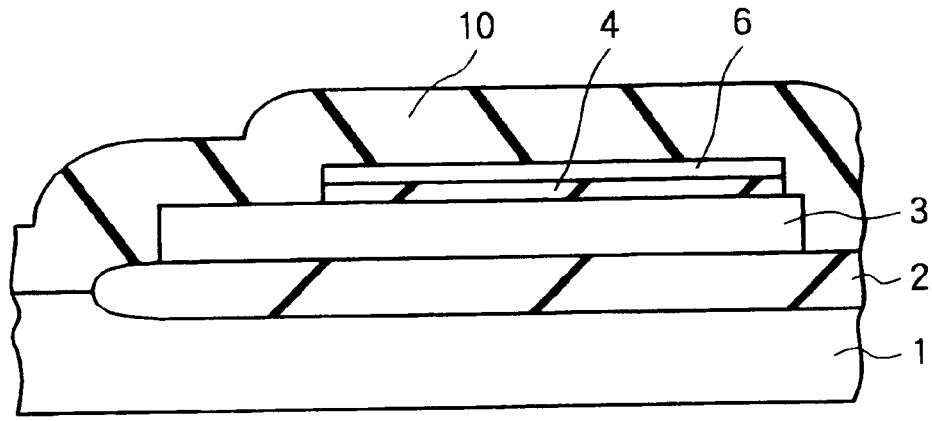
Figure 8B:
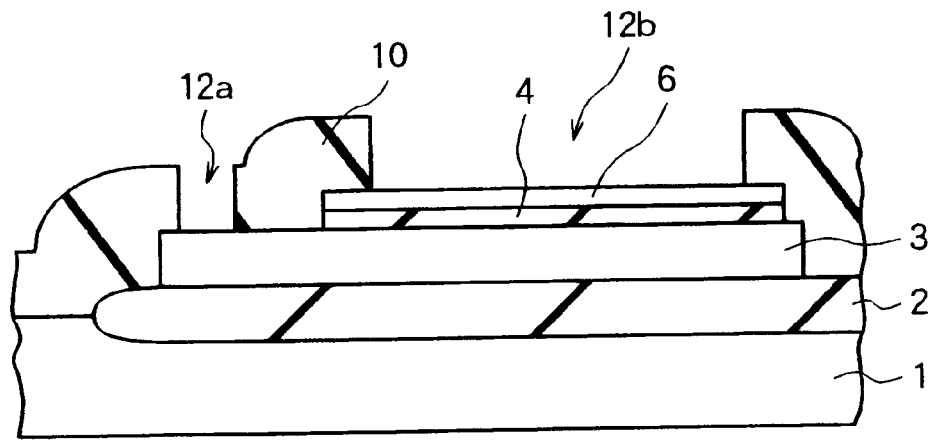
Figure 8C:
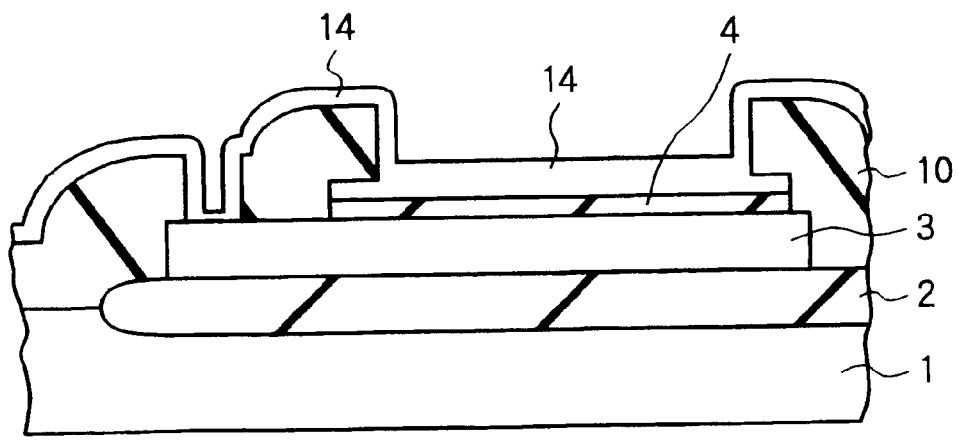

Successively, as shown in FIG. 8A, a silicon oxide film 10 having a film thickness of about 500 nm is deposited all over the surface of the substrate 1 as an interlayer insulating film by the CVD method, for instance. Further, as shown in FIG. 8B, the silicon oxide film 10 is etched by the RIE method, to form a contact hole 12a at a region where the silicon nitride film 4 and the Al film 6 are both not formed on the poly-crystal silicon film 3 and another hole 12b on the Al film 6. Further, as shown in FIG. 8C, after the natural oxide film formed at the bottom of the contact hole 12a has been removed by the sputtering of Ar gas, an Al film 14 containing silicon of 1 at % is deposited by the sputtering, for instance. Further, the Al film 6 is shown together with the Al film 14.

Figure 9:
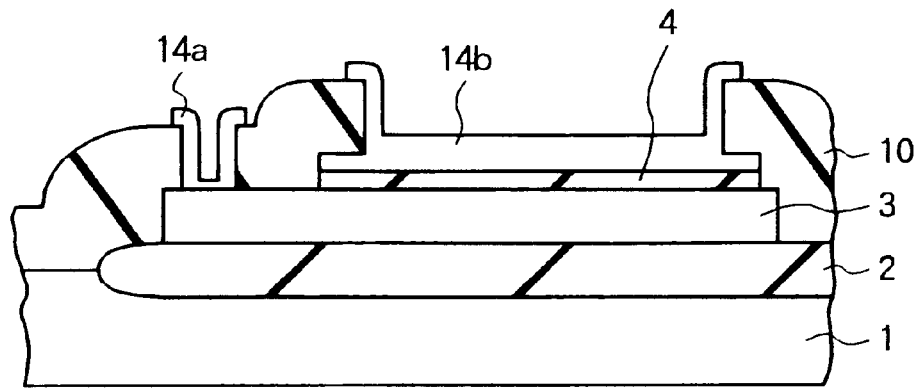

Further, as shown in FIG. 9, a lower electrode (the wire 14a) and an upper electrode 14b of the capacitor are both patterned by etching the Al film 14 anisotropically by the RIE method, for instance. Further, after the substrate has been sintered within a forming gas atmosphere at 450° C., for instance, a silicon oxide film (not shown) having a film thickness of about 1000 nm is formed on the surface of the substrate 1 as a passivation film.

As described above, in the third embodiment of the semiconductor device according to the present invention, when the Al film 14 is being formed by the sputtering, since the capacitance forming region is covered with the Al film 16, the capacitance insulating film 4 is not cut down by the sputtering (prior to the sputtering), so that it is possible to obtain an excellent controllability of the capacitance of the formed capacitor.

Further, in this embodiment, although the poly-crystal silicon film 3 used as the lower electrode of the capacitor is not silicided, even if this film 3 is silicided, it is of course possible to obtain the same effect with respect to the controllability of the thickness of the insulating film of the capacitor. Further, even if metal, metal silicide or a laminate structure of both is adopted as the lower capacitance electrode, it is of course possible to obtain the same effect with respect to the controllability of the thickness of the insulating film of the capacitor. In addition, even if the Al film 6 deposited on the silicon nitride film in order to protect the capacitance insulating film 4 is replaced with another metal, semiconductor, metal silicide, or a laminate structure of these, it is of course possible to obtain the same effect as above.

Further, in the present embodiment, although the silicon nitride is used as the insulating film 4 of the capacitor, even if the other insulating film such as silicon oxide, a laminate film of silicon nitride and silicon oxide, etc. is used, it is of course possible to obtain the same effect with respect to the controllability of the thickness of the insulating film of the capacitor.

Further, in this embodiment, although the insulating film for forming the capacitor insulating film 4 is removed except the capacitor forming region, even if this insulating film is kept remaining at the area other than the capacitor forming region, it is of course possible to obtain the same effect with respect to the controllability of the thickness of the insulating film of the capacitor.

Fourth Embodiment

Figure 10A:
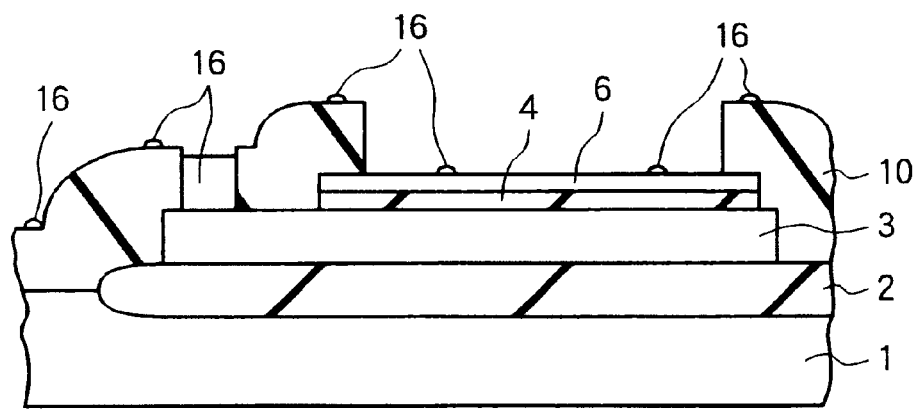
FIGS. 10A and 10B are cross-sectional views for assistance in explaining a fourth embodiment of the method of manufacturing the semiconductor device according to the present invention.

The fourth embodiment of the method of manufacturing the semiconductor device according to the present invention will be described hereinbelow with reference to FIGS. 10A and 10B.

The process of forming the contact hole 12a with the poly-crystal silicon film 3 formed as the lower capacitor electrode; that is, the process to the step shown in FIG. 8B is the same as with the case of the third embodiment. After that, as shown in FIG. 10A, the natural oxide film is removed by the sputtering of Ar gas, and tungsten 16 is buried in the contact hole 12a by use of the selective chemical vapor phase epitaxy method.

Figure 10B:
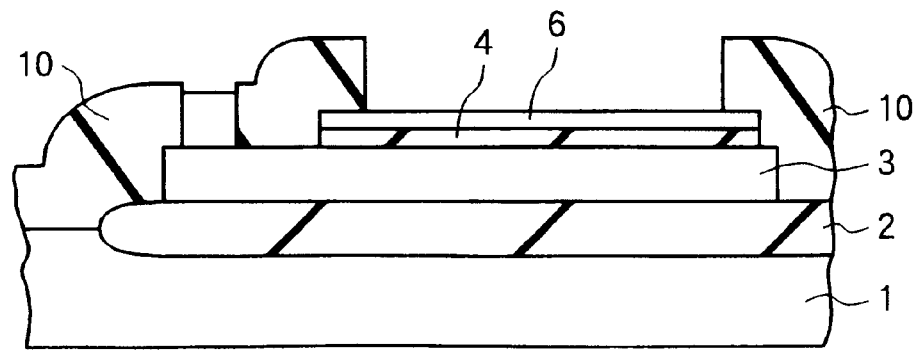

Further, as shown in FIG. 10B, after a resist has been applied all over the substrate 1, excessive tungsten produced by the preceding step is removed by the RIE method within a mixed gas atmosphere of $SF_6$ and $O_2$ (1:2) under pressure of 50 mTorr and at temperature of 60° C.

After that, the semiconductor device is completed by processing the device in the steps after that shown in FIG. 8C, in the same as with the case of the third embodiment.

The fourth embodiment can of course provide the same effect as with the case of the third embodiment.

Fifth Embodiment

Figure 11A:
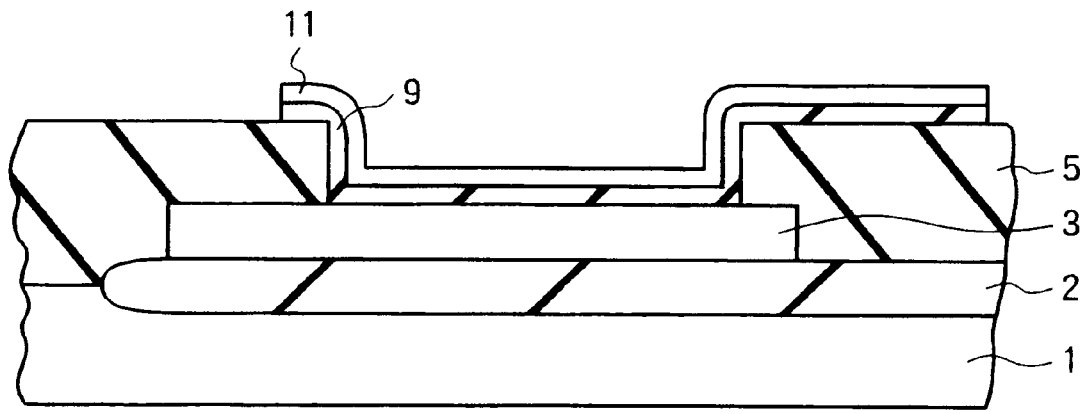
FIGS. 11A to 11C are cross-sectional views for assistance in explaining a fifth embodiment of the method of manufacturing the semiconductor device according to the present invention.

The fifth embodiment of the method of manufacturing the semiconductor device according to the present invention will be described hereinbelow with reference to FIGS. 11A to 11B.

The process of this fifth embodiment is the same as with the case of the first embodiment to the step shown in FIG. 2C. After that, as shown in FIG. 11A, the Al film 11 (i.e., the upper capacitor electrode) and the insulating film 9 are patterned so as to remain not only on the capacitor forming region but also on the silicon oxide film 5. In this case, the Al film 11 remaining on the silicon oxide film 5 is a region as a contact with the upper capacitor electrode. Further, as shown in FIG. 11B, after a silicon oxide film 21 having a film thickness of about 5000 Å has been deposited as an interlayer insulating film all over the surface of the substrate 1 by use of the CVD method, two contact holes 22a and 22b are opened by patterning the silicon oxide film 21 by use of RIE method. Further, as shown in FIG. 11C, after the natural oxide film formed at the bottom of the contact hole 22a has been removed by the sputtering of Ar gas, two wires 23a and 23b are both formed in accordance with the ordinary wire forming process.

As described above, in the fifth embodiment of the semiconductor device manufacturing method according to the present invention, when the Al wires 23a and 23b are being formed, since the Al film 11 and the silicon oxide film 21 are both formed on the insulating region 9 at the capacitance region, the capacitance insulating film 9 is not cut down by the sputtering (prior to the sputtering), so that it is possible to obtain an excellent controllability of the capacitance of the formed capacitor.

Sixth Embodiment

Figure 12A:
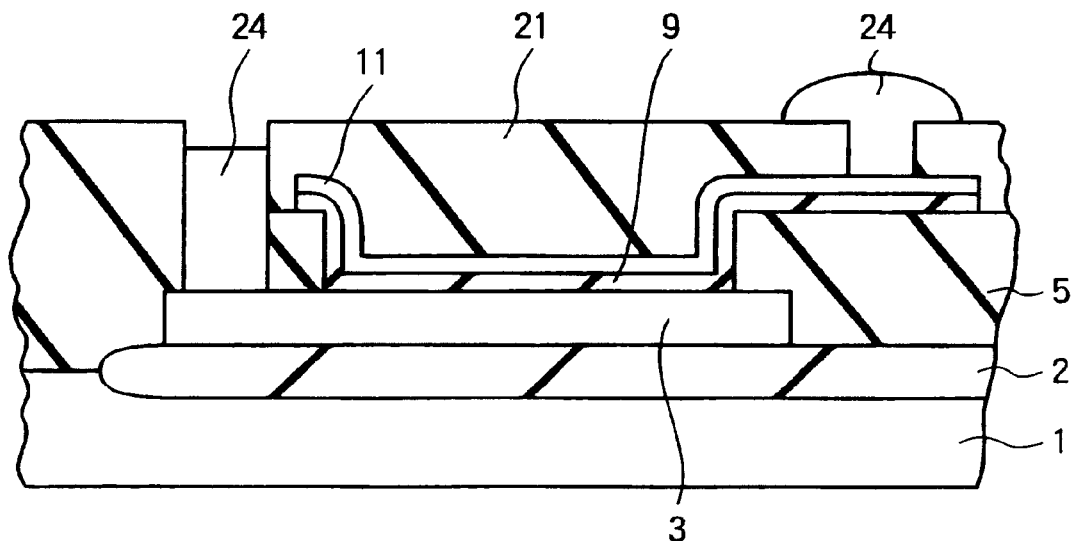
FIGS. 12A and 12B are cross-sectional views for assistance in explaining a sixth embodiment of the method of manufacturing the semiconductor device according to the present invention.

The sixth embodiment of the method of manufacturing the semiconductor device according to the present invention will be described hereinbelow with reference to FIGS. 12A and 12B.

Figure 11B:
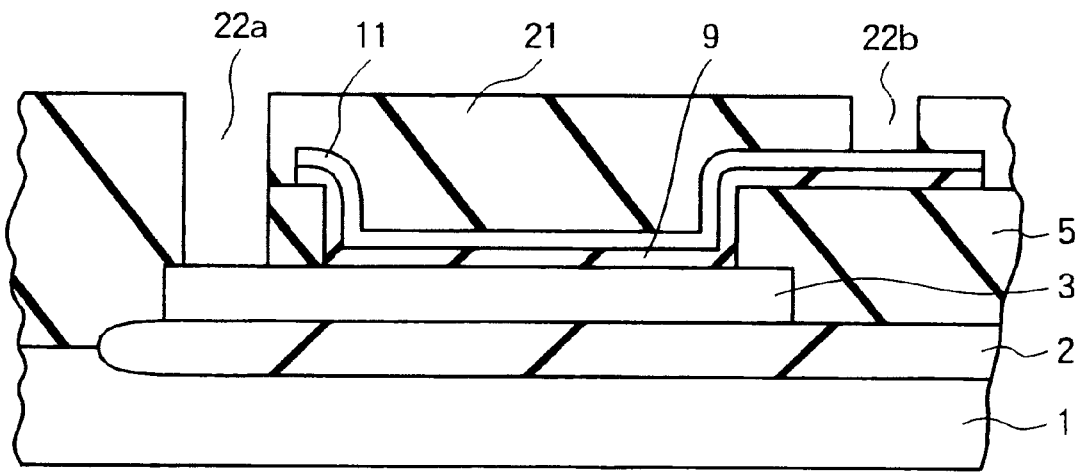
Figure 11C:
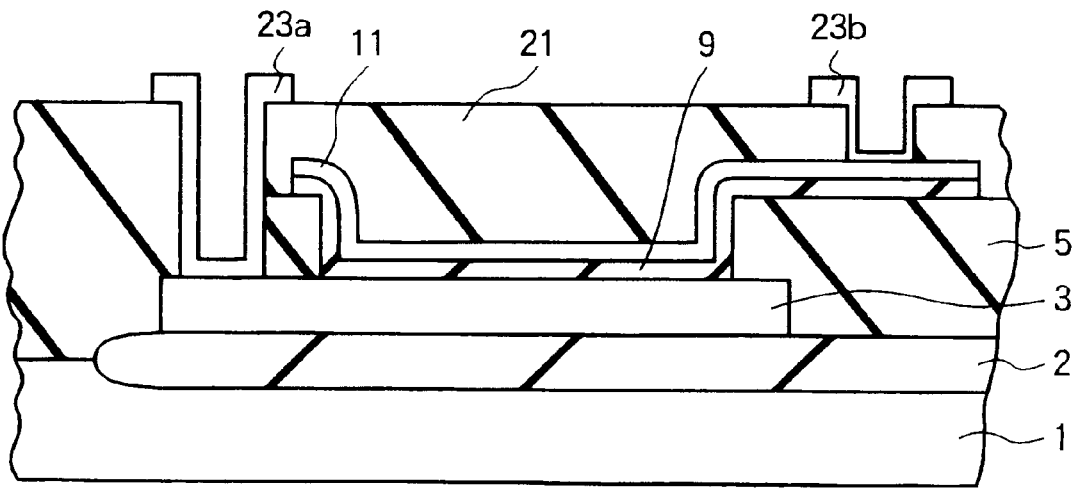

The manufacturing method of this embodiment is the same as with the case of the fifth embodiment to the step as shown in FIG. 11B. After that, as shown in FIG. 12A, the natural oxide film is removed by the sputtering of Ar gas. Further, tungsten is selectively grown in the contact holes 22a and 22b by use of the selective chemical vapor phase epitaxy method.

Figure 12B:
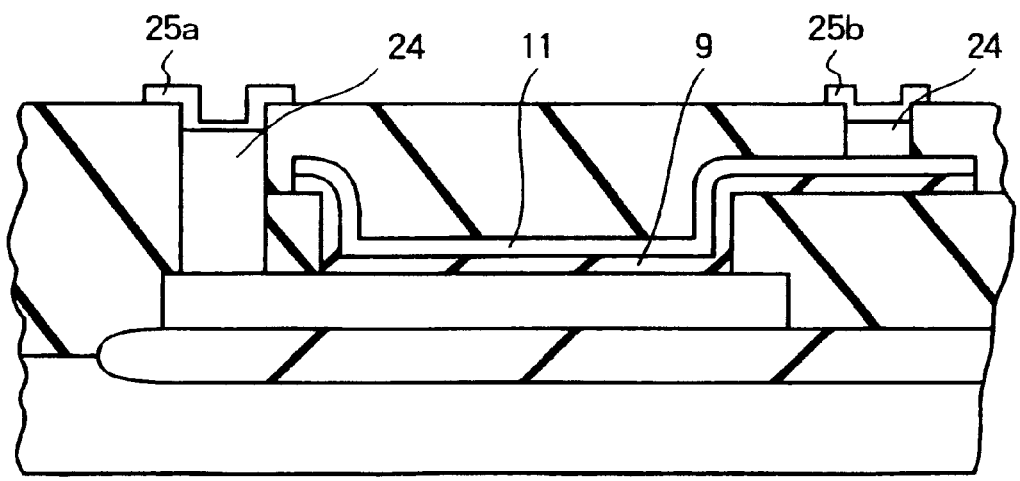
Figure 13A:
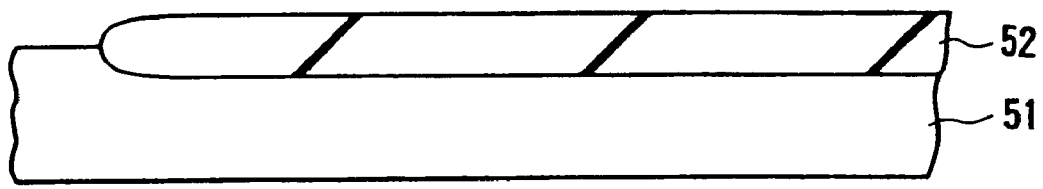
FIGS. 13A to 13C, FIGS. 14A to 14C, and FIGS. 15A to 15C are cross-sectional views for assistance in explaining a first conventional method of manufacturing the conventional semiconductor device.
Figure 13B:
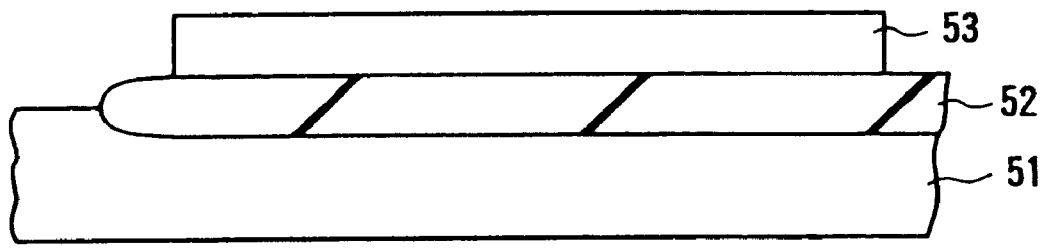
Figure 13C:
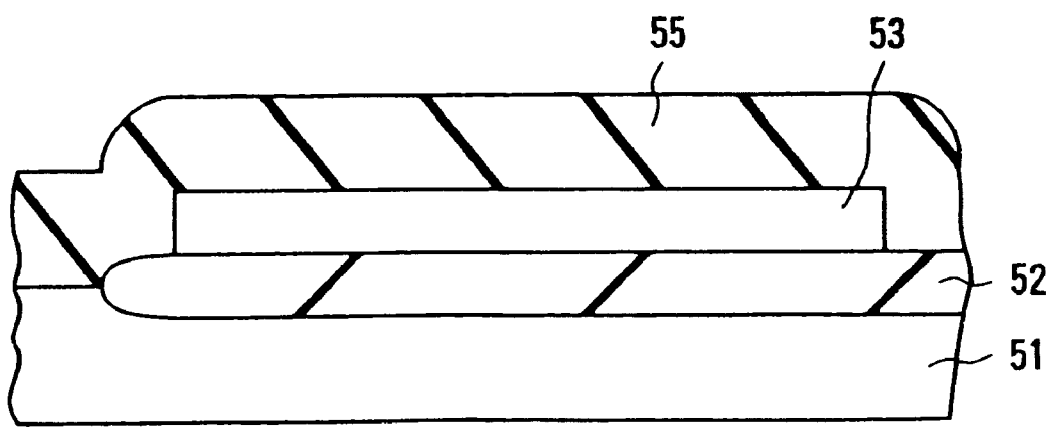
Figure 14A:
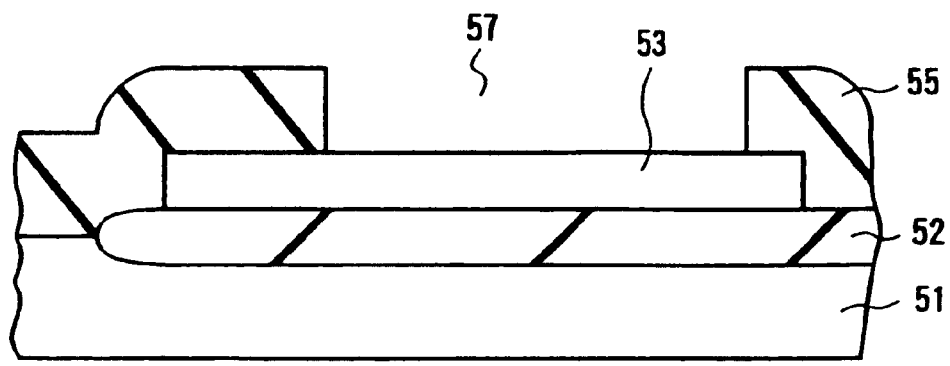
Figure 14B:
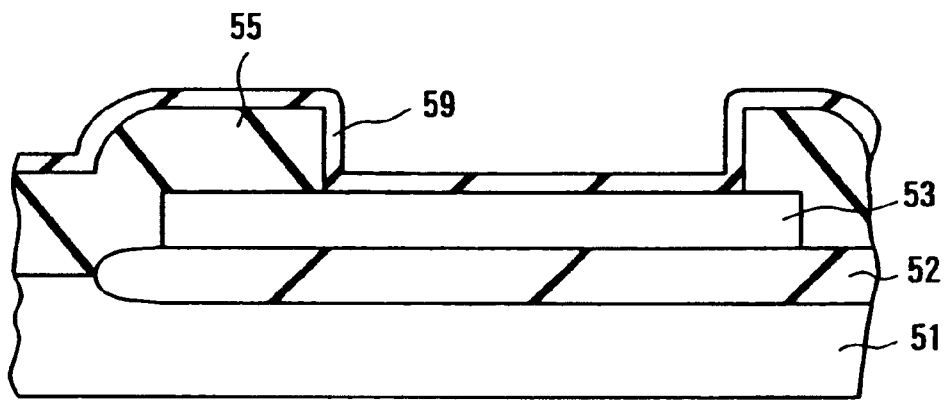
Figure 14C:
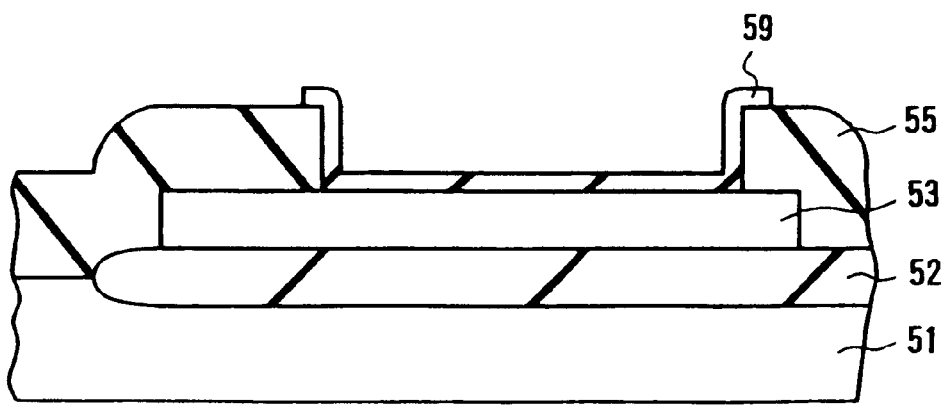
Figure 15A:
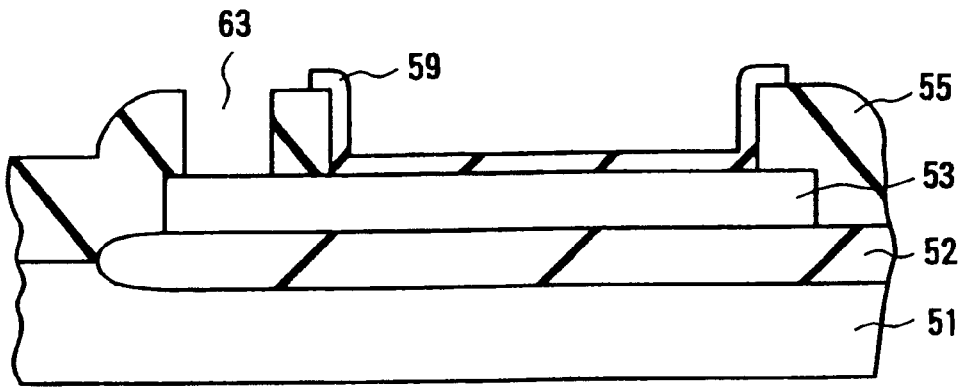
Figure 15B:
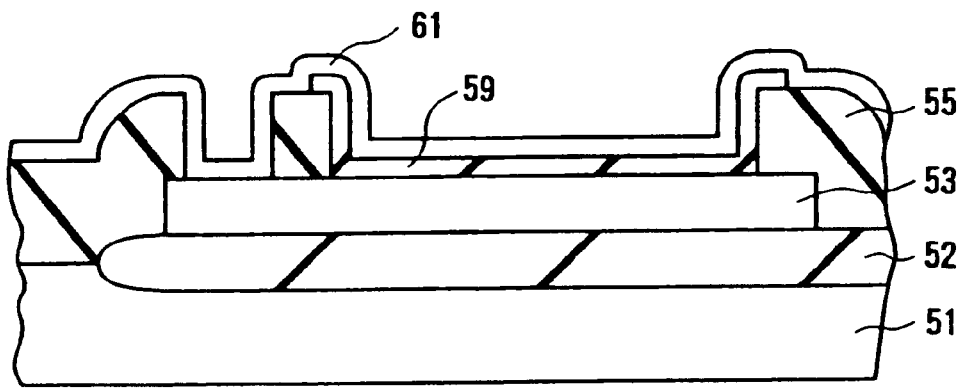
Figure 15C:
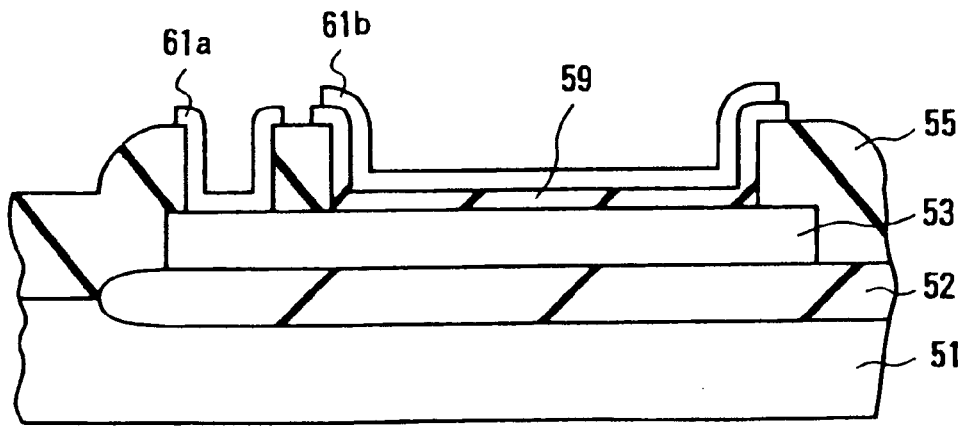

Further, as shown in FIG. 12B, after excessive tungsten produced by the preceding step has been removed by the etching method of the RIE method, the two wires 25a and 25b are both formed by the ordinary wire forming method.

The present embodiment can of course provide the same effect as with the case of the fifth embodiments.

Seventh Embodiment

Figure 16:
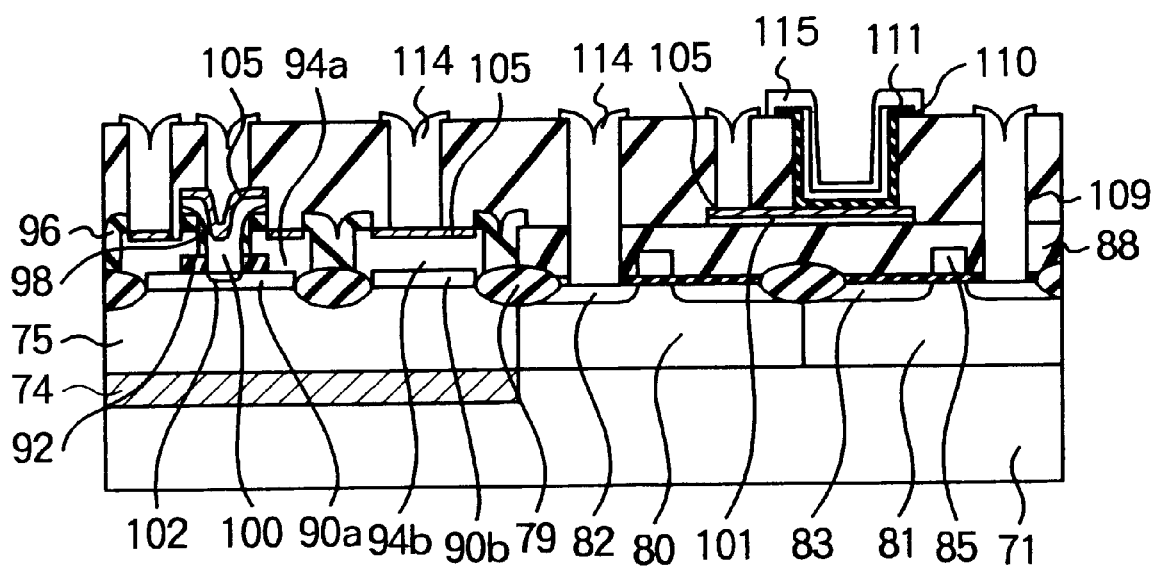
FIG. 16 is a cross-sectional view showing a seventh embodiment of the semiconductor device according to the present invention.

The seventh embodiment of the semiconductor device according to the present invention will be described hereinbelow with reference to FIG. 16. The semiconductor device of this embodiment is a Bi-CMOS device having a capacitor, in which an $N^+$-type buried layer 74 is formed at a region on a silicon substrate 71 where a bipolar transistor is formed. On this $N^+$-type buried layer 74, an N-type monocrystal silicon layer 75 is formed. Further, on this monocrystal silicon layer 75, a P-type base region 90a and an N-type collector region 90b separated by an element separating oxide film 79 are both formed.

Further, an N-type emitter region 102 is formed in the base region 90a. An insulating film 92 is formed at the base region 90a so as to surround the emitter region 102. Further, a base leading electrode 94a of poly-crystal silicon is formed on the base region 90a and the insulating film 92. Further, a contact hole connected to the emitter region 102 is formed on the base leading electrode 94a and the insulating film 92. An emitter electrode 100 formed of poly-crystal silicon is buried in this contact hole. Further, the emitter electrode 100 and the base leading electrode 94a are electrically insulated from each other by an insulating film 98 formed on the side surface of the contact hole and an insulating film 96 formed on the base leading electrode 94a.

Further, a collector leading electrode 94b of poly-crystal silicon is formed at the collector region 90b. The collector leading electrode 94b and the base leading electrode 94a are electrically separated from each other by the insulating film 96. The collector leading electrode 94b, the base leading electrode 94a and the emitter leading electrode 100 are all covered with an interlayer insulating film 109. In this interlayer insulating film 109, contact holes are formed for contact with the above-mentioned electrodes 94a and 94b and 100. These contact holes are buried by wires 114. Further, a silicide layer 105 of a high melting point is formed in a contact surface between the wires 114 and the electrodes 94a and 94b and 100.

On the other hand, a P well 80 and an N well 81 are formed on the silicon substrate 71 at a region where a MOSFET is to be formed. On the P well 80 and the N well 81, respective gates 85 are formed. On the P well 80, a N-type source-drain region 82 is formed so as to sandwich the gate electrode 85. In the same way, on the N well 81, a P-type source-drain region 83 is formed so as to sandwich the gate electrode 85.

Further, an insulating film 88 is formed so as to cover these gate electrodes 85 and the source-drain regions 82 and 83. A lower capacitor electrode 101 of poly-crystal silicon is formed on the insulating film 88. Further, on the surface of the lower electrode 101, a silicide layer 105 is formed. On the lower electrodes 101 and 105 and the insulating film 88, an interlayer insulating film 109 is formed. In this inter-layer insulating film 109, contact holes for connection of the source-drain regions 82 and 83 and the lower electrodes 101 and 105 are formed, respectively. Further, a hole for forming a capacitor is also formed. The surface of the lower capacitor electrode 105 is exposed to the bottom portion of this capacitor contact hole. Further, an capacitor insulating film 110 and a metal film 111 are laminated in sequence in the capacitor contact hole. Further, a wire 115 is formed on the metal films 111 formed in this capacitor contact hole. Further, a wire is buried in this capacitor contact hole.

Eighth Embodiment

The eight embodiment of the method of manufacturing the semiconductor device as described in the seventh embodiment according to the present invention will be described hereinbelow with reference to FIGS. 17A to 17C, FIGS. 18A to 18C, FIGS. 19A to 19C, and FIGS. 20A to 20C.

Figure 17A:
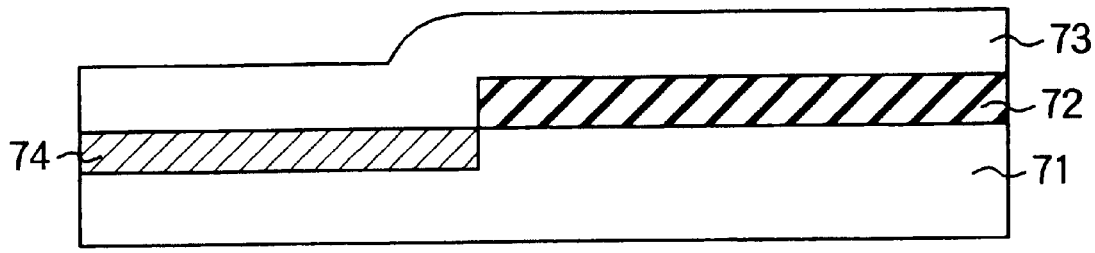
FIGS. 17A to 17C, FIGS. 18A to 18C, FIGS. 19A to 19C, and FIGS. 20A to 20C are cross-sectional views for assistance in explaining an eighth embodiment of the method of manufacturing the semiconductor device according to the present invention.

First, as shown in FIG. 17A, after an oxide film 72 has been formed on a silicon substrate 71 by the thermal oxidization, the formed oxide film 72 is patterned by etching with the use of the photolithography and HF based solution, to remove the oxide film 72 from a region where a buried layer is to be formed. Successively, after a glass layer 73 containing Sb is formed all over the surface of the silicon substrate 71, Sb is diffused in the silicon substrate 71 by thermal process, to form an $N^+$ buried layer 74.

Figure 17B:
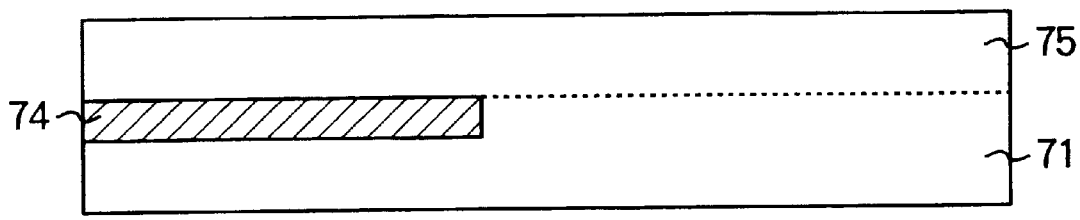

After that, as shown in FIG. 17B, after the glass layer 73 and the oxide film 72 have been both peeled off by use of the HF based solution, a monocrystal silicon layer 75 containing phosphorous of $3.0 \times 10^{16}$ cm$^{-3}$ is formed all over the substrate by epitaxial growth method.

Figure 17C:
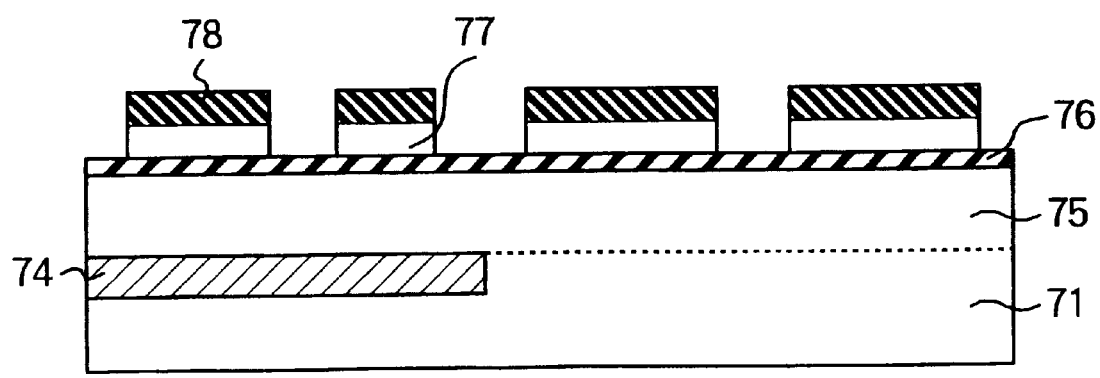

Successively, as shown in FIG. 17C, after the substrate surface has been oxidized to form an oxide film 76 having a film thickness of about 500 Å, a poly-crystal silicon layer 77 having a film thickness of about 1000 Å and a silicon nitride film 78 having a film thickness of about 1500 Å are both deposited in sequence. Further, the silicon nitride film 78 and the poly-crystal silicon film 77 are both removed, by use of the photolithography and the RIE (Reactive-Ion Etching), from regions where the element separating regions are to be formed.

Figure 18A:
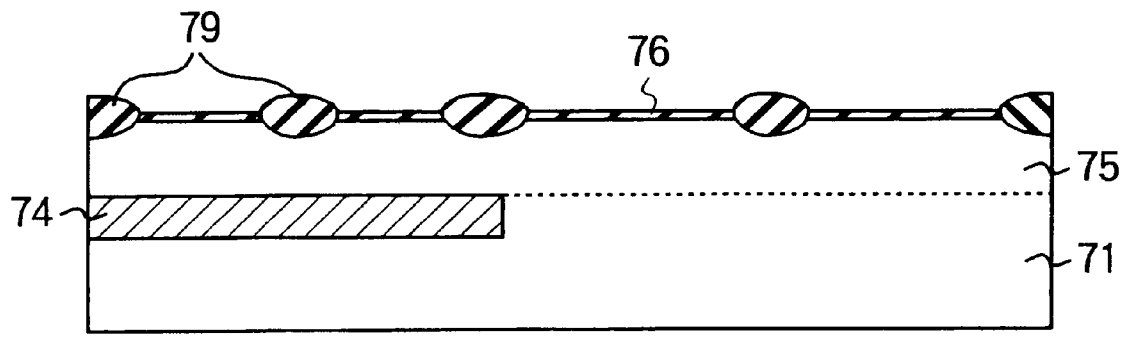

Successively, as shown in FIG. 18A, an element separating oxide film 79 is formed on the region from which the silicon nitride film 78 and the poly-crystal silicon film 77 have been both removed. Successively, the silicon nitride film 78 and the poly-crystal silicon film 77 are both removed by the CDE (Chemical Dry Etching) method.

Figure 18B:
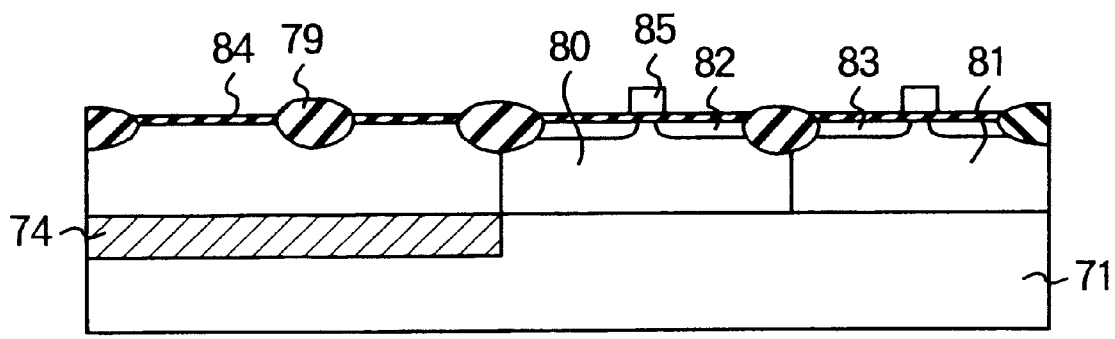

Further, as shown in FIG. 18B, a P well 80 and an N well 81 are formed at regions at which the MOSFETs are to be formed by use of the photolithography and ion implanting technique. Successively, channels are formed by ion implantation. Further, after a oxide film 76 formed on the element region has been removed, a gate oxide film 84 is formed by the thermal oxidization. Further, a poly-crystal silicon having a film thickness of about 3000 Å has been deposited all over the substrate surface, the substrate is patterned to form the gate electrodes 85. After that, an N-type diffusion layer 82 and a P-type diffusion layer 83 (where source-drain regions are to be formed) are both formed by the photolithography and the ion implantation technique.

Figure 18C:
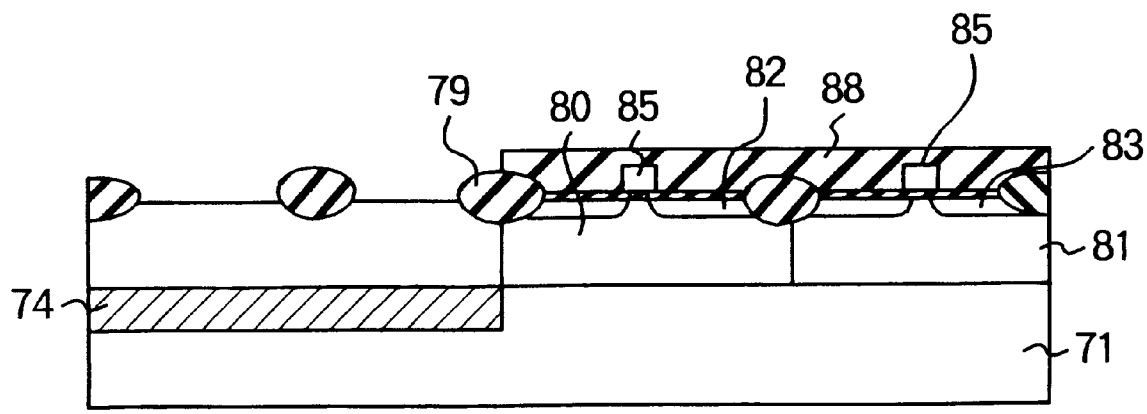

Further, as shown in FIG. 18C, after a silicon oxide film 88 having a film thickness of about 3000 Å has been deposited all over the substrate surface by the LPCVD method, the silicon oxide film 88 formed on a region at which a bipolar transistor is to be formed is removed by patterning by the photolithography and by wet etching using the HF based solution, to expose the monocrystal silicon layer 75 and the element separating oxide film 79 formed on the silicon substrate 71.

Figure 19A:
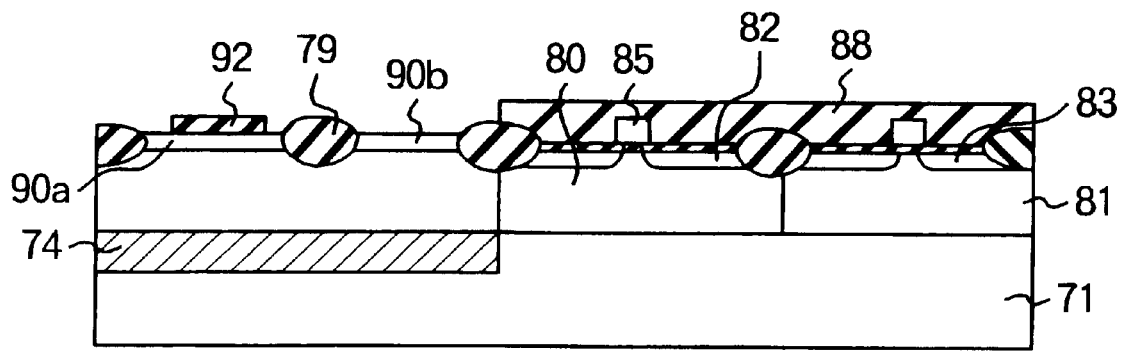

Further, as shown in FIG. 19A, a monocrystal silicon layer 90a or 90b containing P-type impurities (e.g., boron) is formed on the exposed monocrystal silicon layer 75 by use of the selective epitaxial technique. After that, a silicon oxide film is deposited all over the substrate surface. The deposited silicon oxide film is patterned to form an etching stopper film 92 remaining on a region where a base region is to be formed by patterning this silicon oxide film.

Figure 19B:
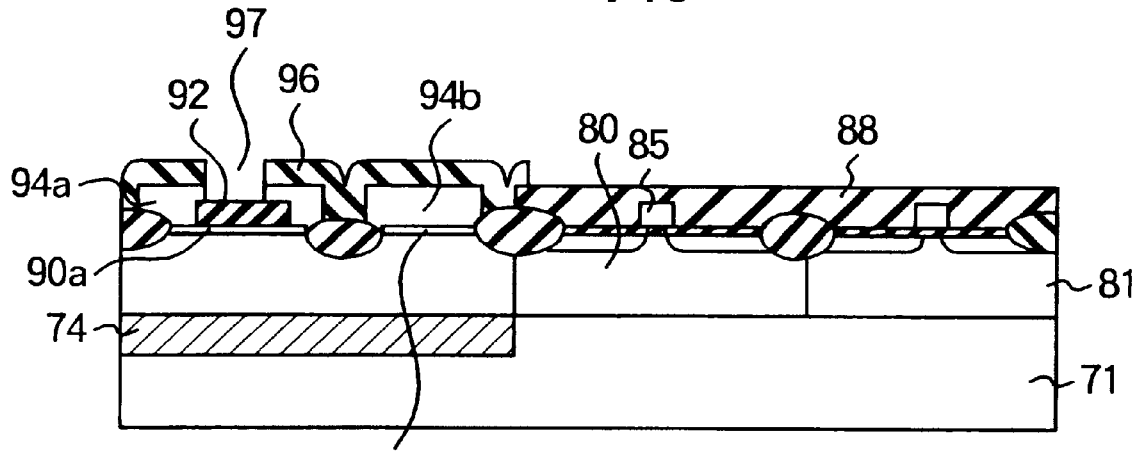

Further, as shown in FIG. 19B, a poly-crystal silicon film has been deposited all over the substrate surface, a base leading electrode 94a and a collector leading electrode 94b are both formed by patterning. Further, the P-type impurities are implanted in the base leading electrode 94a and further the N-type impurities are implanted in the collector leading electrode 94b. In this process, since the N-type impurities are implanted in the P-type monocrystal silicon layer 90b formed under the collector leading electrode 94b, the P-type monocrystal silicon layer 90b is inverted to the N-type. After that, a silicon nitride film 96 is deposited at the bipolar transistor forming region by use of the CVD (Chemical Vapor Deposition). Further, the silicon nitride film 96 and the poly-crystal silicon film 94a formed on the etching stopper film 92 are both removed by use of the RIE method, to open a hole 97 for forming an emitter region.

Figure 19C:
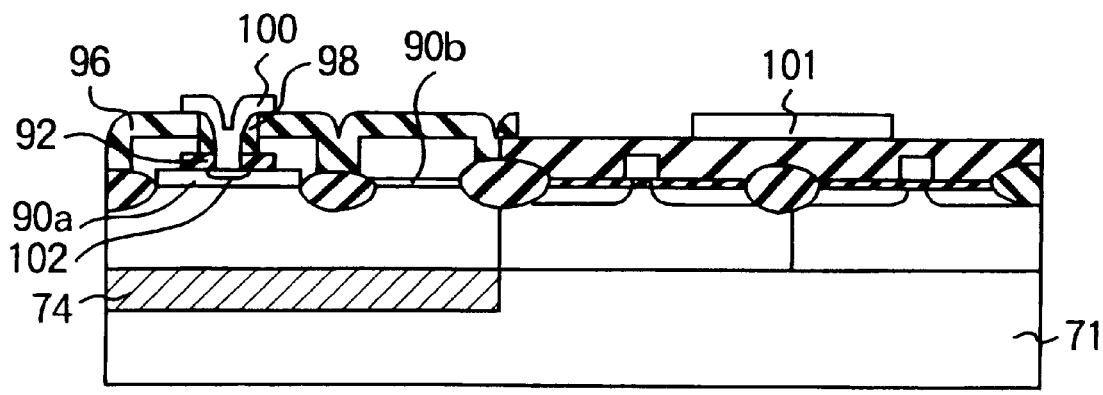

Successively, as shown in FIG. 19C, a nitride film is deposited all over the substrate surface by use of the CVD method, and a side wall 98 is formed on a side surface of the hole 97 by the RIE method. Further, by use of the formed side wall 98 as a mask, the etching stopper film 92 is etched by use of the wet etching, to expose the monocrystal silicon layer 90a, without damaging the monocrystal silicon layer 90a to be used as the base region. Further, after a poly-crystal silicon layer has been deposited all over the substrate surface, N-type impurities are implanted in the poly-crystal silicon layer, and further an emitter region 102 is formed in the base region 90a by thermal process. After that, the poly-crystal silicon layer containing N-type impurities is patterned to form an emitter electrode 100 at the bipolar transistor forming region and a lower capacitor electrode 101 at the MOSFET forming region.

Figure 20A:
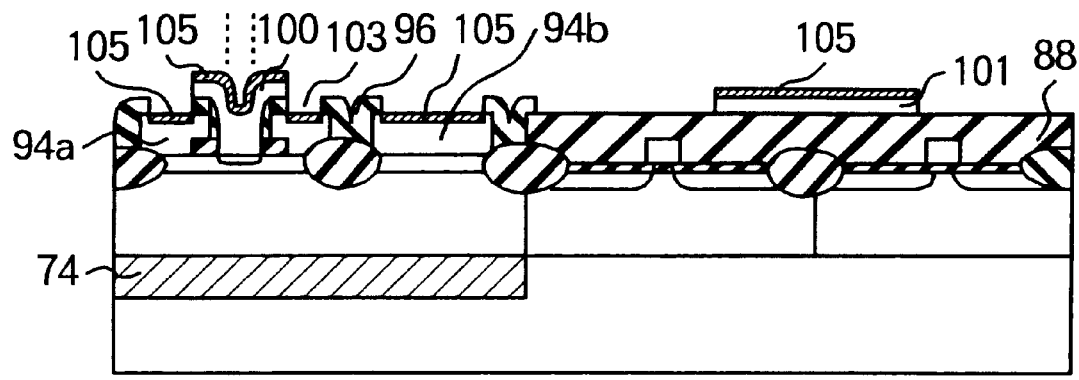

Further, as shown in FIG. 20A, after the insulating film 96 has been patterned to remove the insulating film 96 from the base leading electrode 94a and the collector leading electrode 94b, a metal of a high melting point (e.g., Ti, Co, Ni, etc.) is deposited all over the substrate. Further, a silicide layer 105 of a high melting point 105 is formed on the respective surfaces of the base leading electrode 94a, the collector leading electrode 94b, the emitter electrode 100, and the lower capacitor electrode 101 by the thermal process. Further, the non-reacted high melting point metal is selectively removed by a mixed liquid of sulfuric acid and hydrogen peroxide.

Figure 20B:
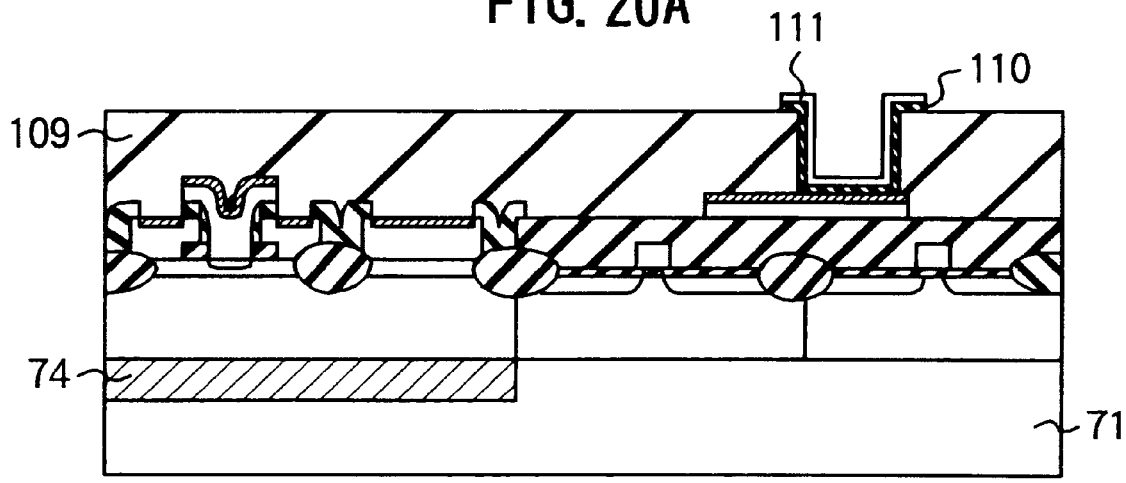

Further, as shown in FIG. 20B, a silicon oxide film having a film thickness of about 8000 Å is deposited all over the substrate surface by use of the LPCVD method, to form an interlayer insulating film 109 to be formed under a first layer Al wiring. Further, after a hole has been formed in the interlayer insulating film 109 at the lower capacitor electrode 101 or 105, a silicon nitride film 110 used as a capacitor insulating film and a thin metal film 111 (e.g., TiN) are both deposited in sequence and then patterned. Here, without being limited only to SiN, the other dielectric substances such as $SiO_2$ can be used as the capacitor insulating material. Further, as the material of the thin metal film 111, it is possible to use Al, W, Cu, Ti or high melting point metal silicide.

Figure 20C:
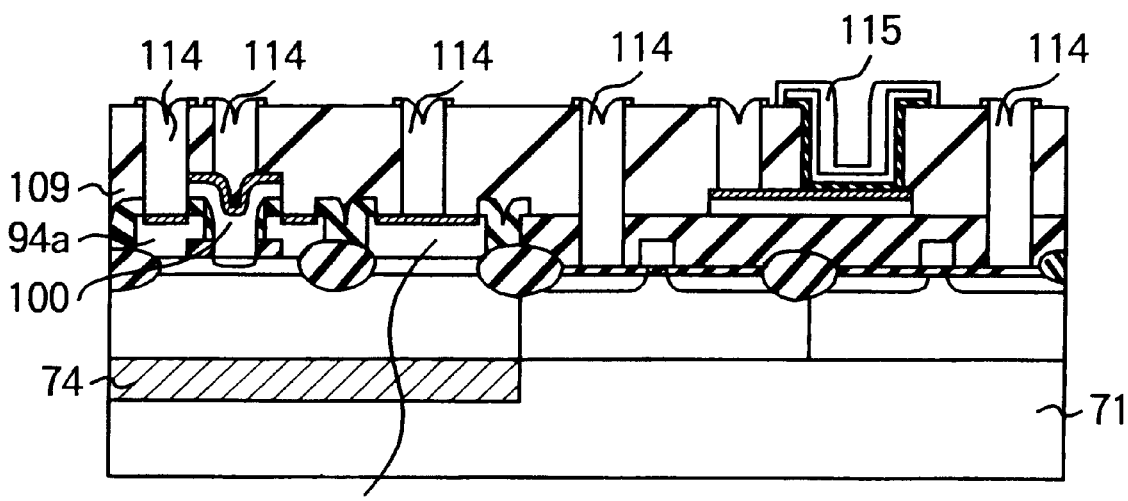

Further, as shown in FIG. 20C, after various contact holes have been opened in the interlayer insulating film 109 at the source and drain regions 82 and 83 and the gate electrodes 85 of the MOSFETs, the base leading electrode 94a, the collector leading electrode 94b and the emitter region 100 of the bipolar transistor, and the lower capacitor electrode 101, the natural oxide film formed at the bottoms of these contact holes is removed by the sputtering of Ar gas. Further, after that, a barrier metal layer formed of Ti/TiN for instance has been deposited at the bottoms of the contact holes, a metal formed of Al—Si—Cu alloy, for instance is deposited in the holes by use of the sputtering method and further patterned, to form desired wires 114 and an upper capacitor electrode 115.

Figure 21:
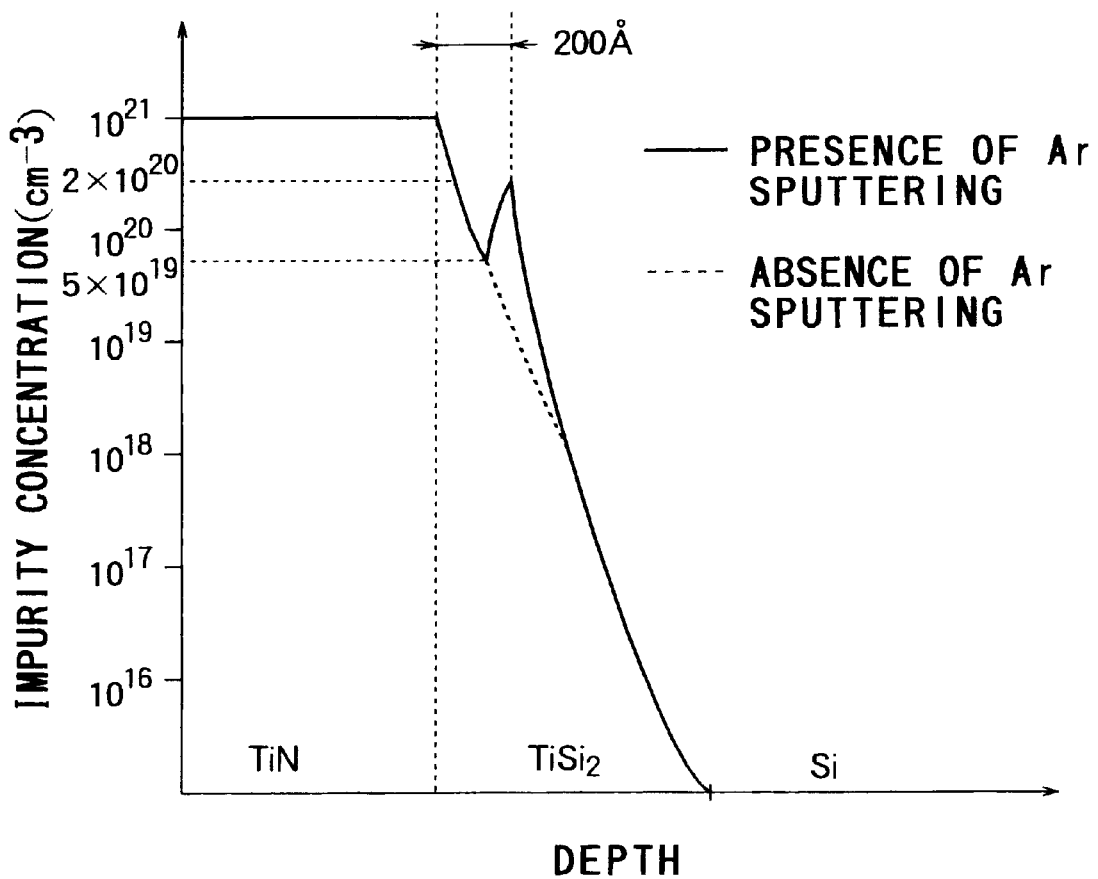
FIG. 21 is a graphical representation showing Ar concentration characteristics in the silicide layer, in comparison between the presence and absence of the Ar sputtering for removing the natural oxide film.

FIG. 21 shows the analysis results of SIMS (Secondary-Ion, Mass Spectroscopy) in the silicide layer 105 of the semiconductor device formed by using Ar sputtering and that of the semiconductor device formed without use of any Ar sputtering. As understood on the basis of the SIMS analysis results, when the semiconductor device is formed by use of the Ar sputtering, a clear Ar peak of a concentration of about $10^{20}$ to $10^{21}$ $cm^{-3}$ appears in the surface of the silicide layer 105; in more detail, at a point about 100 to 300 Å (200 Å in FIG. 21) away from the interface between the barrier metal of TiN and the silicide layer 105 of $TiSi_2$ in the depth direction of the silicide layer 105. The reason why the clear peak appears at a point deep away from the outermost surface of the silicide layer 105 is that the energy of Ar ions used for the Ar sputtering is high thereat.

Figure 22:
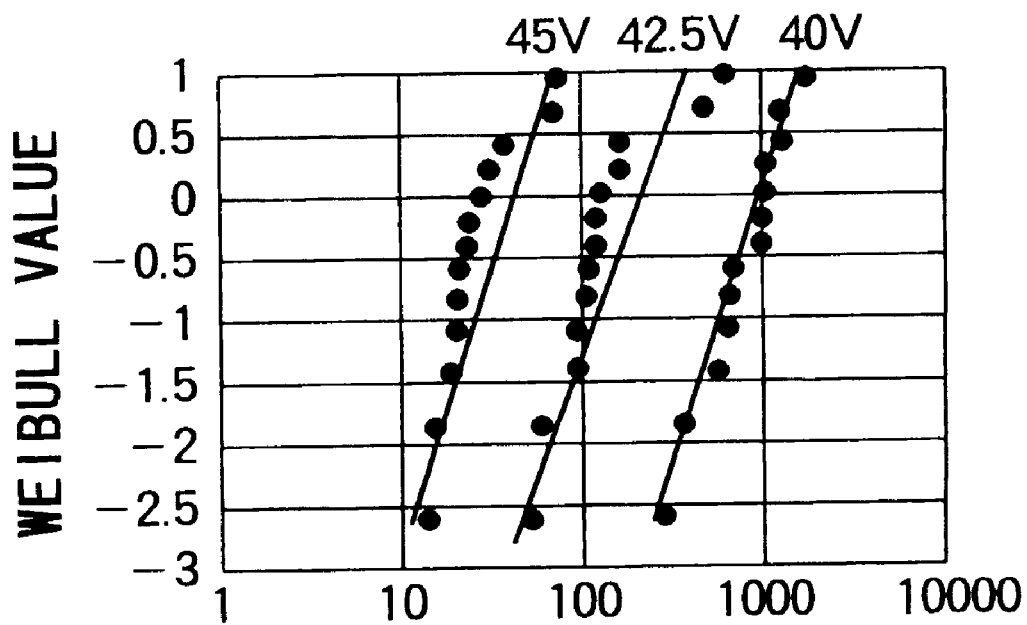
FIG. 22 is a graphical representation showing the TDDB test results of the semiconductor device manufactured by the eighth embodiment of the present invention.

Further, FIG. 22 shows the TDDB (Time Depend Dielectric Breakdown) test results of the semiconductor device manufactured by the method of the eighth embodiment, in which the applied voltages are 40 V, 42.5 V and 45 V (different from the conventional applied voltages). The Weibull plots shown in FIG. 22 indicate that the device reliability is excellent, as compared with that of the conventional device.

As described above, in the semiconductor device according to the present invention, since the thin metal film 111 is formed on the dielectric insulating film 110 of the capacitor, it is possible to prevent the dielectric insulating film 110 from being damaged and the film thickness from being reduced, by the Ar sputtering for removing the natural oxide film before the wire is formed, with the result that the controllability of the capacitance is excellent and thereby the capacitor of high reliability can be obtained.

Ninth Embodiment

Figure 23A:
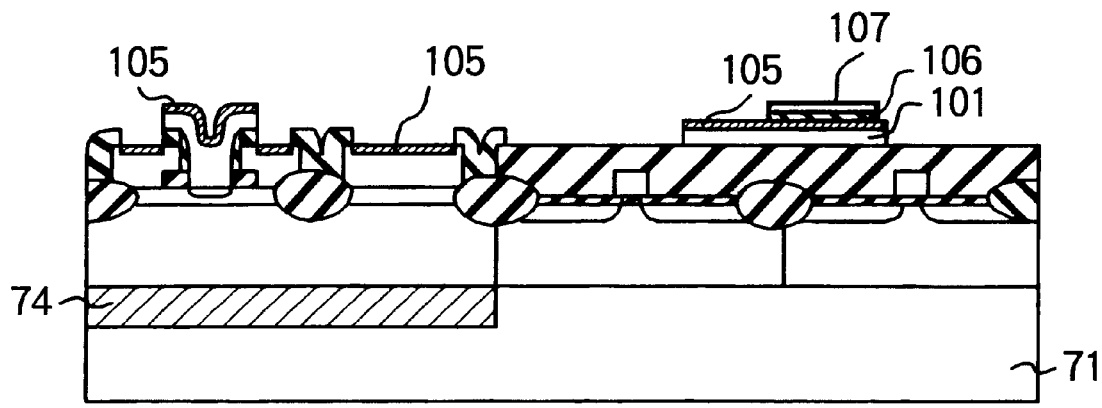
FIGS. 23A and 23B are cross-sectional views for assistance in explaining an ninth embodiment of the method of manufacturing the semiconductor device according to the present invention.

The ninth embodiment of the method of manufacturing the semiconductor device according to the present invention will be described hereinbelow with reference to FIGS. 23A to 23B.

The process of this ninth embodiment is the same as with the case of the eighth embodiment to the step shown in FIG. 20A. After that, as shown in FIG. 23A, a silicon nitride film 106 and a thin metal film 107 are both deposited in sequence, as a capacitor insulating film, on the lower capacitor electrode 101 on the surface of which the silicide layer 105 is formed. After that, the thin metal film 107 and the silicon nitride film 106 are both patterned to their desired shapes.

Figure 23B:
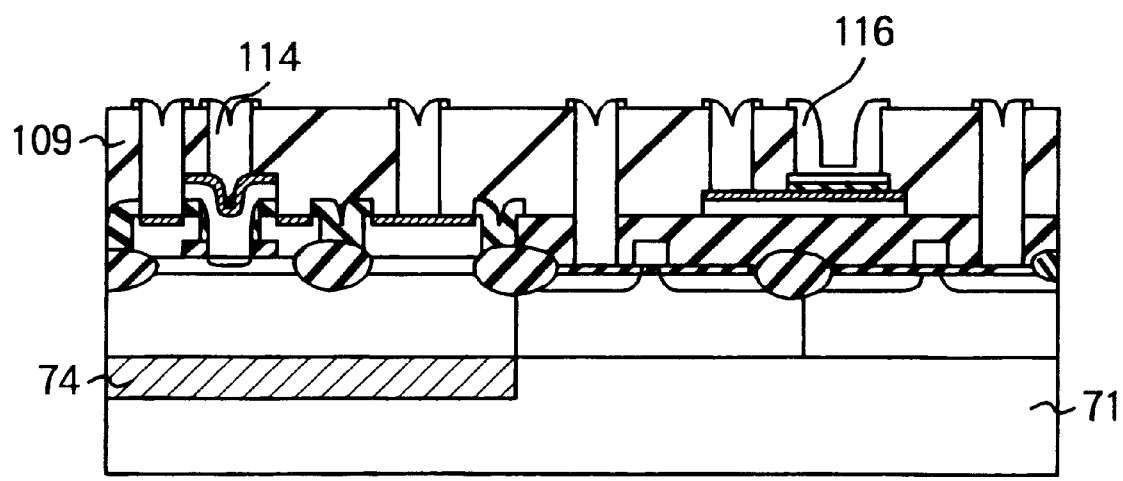

Further, as shown in FIG. 23B, a silicon oxide film having a film thickness of about 8000 Å is deposited all over the surface of the substrate by the LPCVD method, to form an interlayer insulating film 109 under the first layer Al wire. Further, various contact holes are opened in the interlayer insulating film 109 at the source and drain regions 82 and 83 and the gate electrodes 85 of the MOSFET, at the base leading electrode 94a, the collector leading electrode 94b and the emitter electrode 100 of the bipolar transistor, and at the thin metal film 107 of the capacitor. After that, the natural oxide film formed at the bottoms of the contact holes is removed by the Ar sputtering. Further, successively, a barrier metal layer formed of Ti/TiN, for instance and a metal formed of Al—Si—Cu alloy, for instance are deposited in the holes by use of the sputtering method, and then patterned, to form desired wires 114 and an upper capacitor electrode 116.

The ninth embodiment can of course provide the same effect as with the case of the eighth embodiment.

Tenth Embodiment

The tenth embodiment of the method of manufacturing the semiconductor device according to the present invention will be described hereinbelow with reference to FIGS. 24A and 24B, in which the lower capacitor electrode is formed simultaneously when the base leading electrode and the collector leading electrode of the bipolar transistor are formed.

Figure 24A:
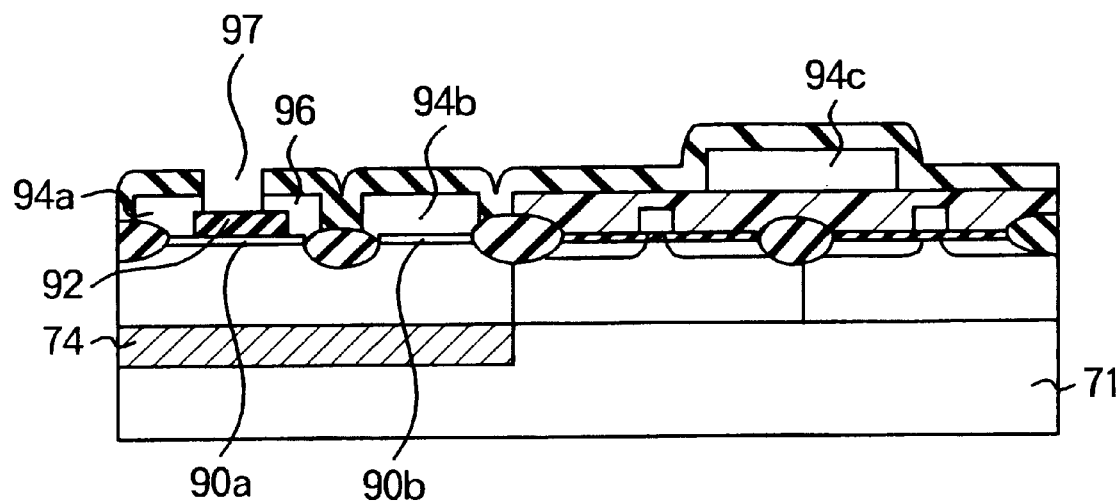
FIGS. 24A and 24B are cross-sectional views for assistance in explaining a tenth embodiment of the method of manufacturing the semiconductor device according to the present invention.

As shown in FIG. 24A, after the substrate has been processed in the same way as with the case of the eighth embodiment to the step as shown in FIG. 19A, a poly-crystal silicon is deposited all over the substrate and then patterned, to form the base leading electrode 94a, the collector leading electrode 94b of the bipolar transistor, and the lower capacitor electrode 94c. Successively, after a silicon nitride film 96 has been formed all over the surface of the substrate, a hole 97 extending to the etching stopper 92 is formed in the silicon nitride film 96 and at the base leading electrode 94a.

Figure 24B:
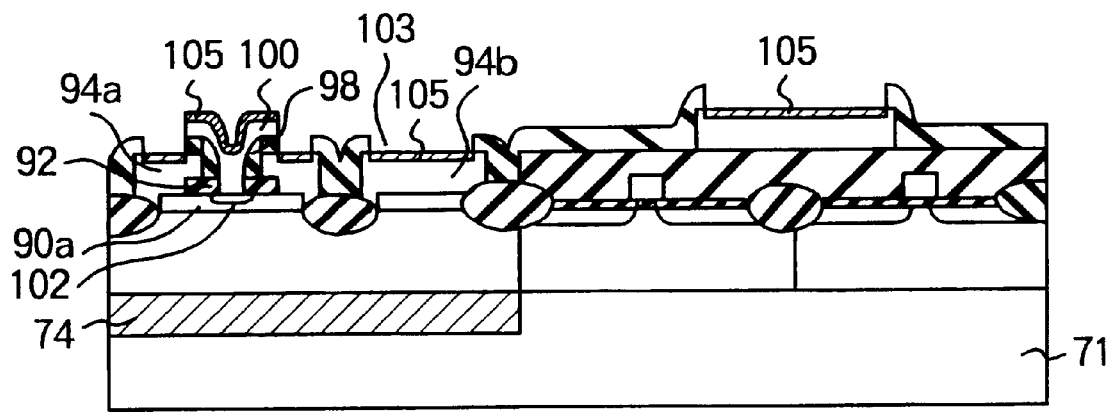

Further, as shown in FIG. 24B, after a side wall 98 formed of silicon nitride, for instance has been formed on the side surface of the hole 97, a hole is formed by etching the etching stopper film 92 with the side wall 98 as a mask in such a way that the base region 90a can be exposed. After that, in the same way as with the case of the eighth embodiment, the emitter electrode 100 of poly-crystal silicon is buried in the formed hole, and further the emitter region 102 is formed in the base region 90a.

Further, after the base leading electrode 94a, the collector leading electrode 94b, and the lower capacitor electrode 94c are all exposed by patterning the insulating film 96, a silicide layer 105 is formed on the surfaces of these electrodes and the emitter electrode 100. After that, the semiconductor device is completed in the same way as with the case of the steps as shown in FIGS. 20B and 20C of the eighth embodiment.

The tenth embodiment of the manufacturing method according to the present invention provides the same effect as with the case of the eighth embodiment.

Eleventh Embodiment

The eleventh embodiment of the method of manufacturing the semiconductor device according to the present invention will be described hereinbelow with reference to FIGS. 25A and 25B, in which the lower capacitor electrode is formed simultaneously when the gate electrodes 85 are formed.

Figure 25A:
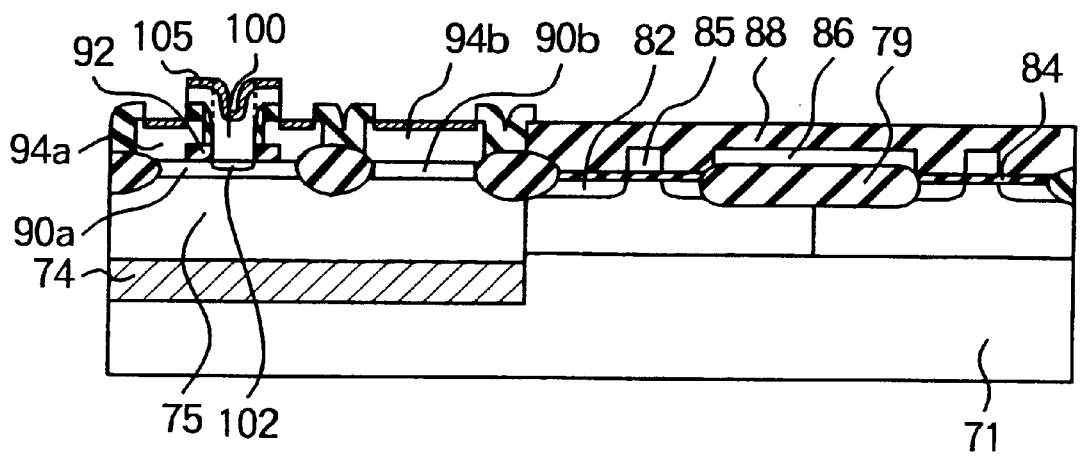
FIGS. 25A and 25B are cross-sectional views for assistance in explaining an eleventh embodiment of the method of manufacturing the semiconductor device according to the present invention.

As shown in FIG. 25A, after the substrate has been processed in the same way as with the case of the eighth embodiment to the step in which the gate oxide film 84 is formed, a poly-crystal silicon having a film thickness of about 3000 Å is deposited all over the substrate and then patterned, to form the gate electrodes 85 at the regions where the NMOSFET and PMOSFET are to be formed. In addition, the lower capacitor electrode 86 is formed on the element separating oxide film 79 between the NMOSFET and the PMOSFET.

Figure 25B:
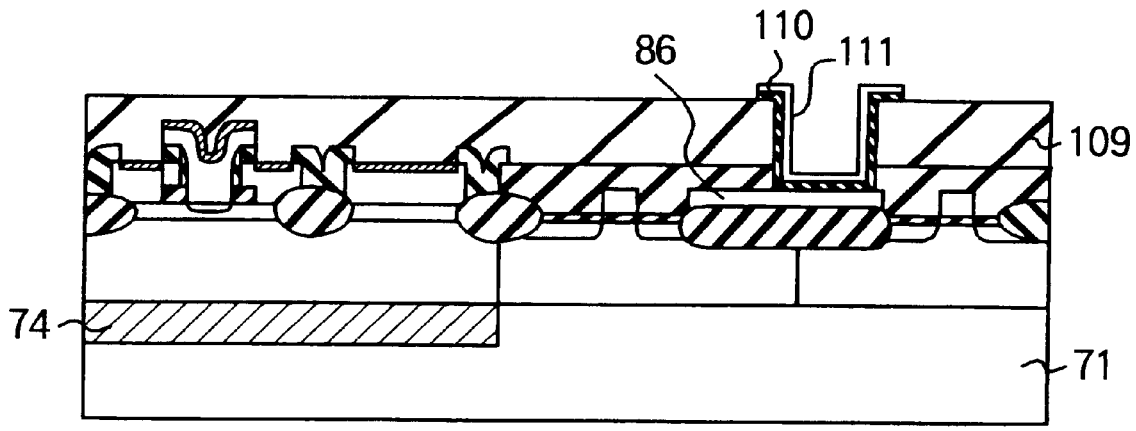
Figure 26A:
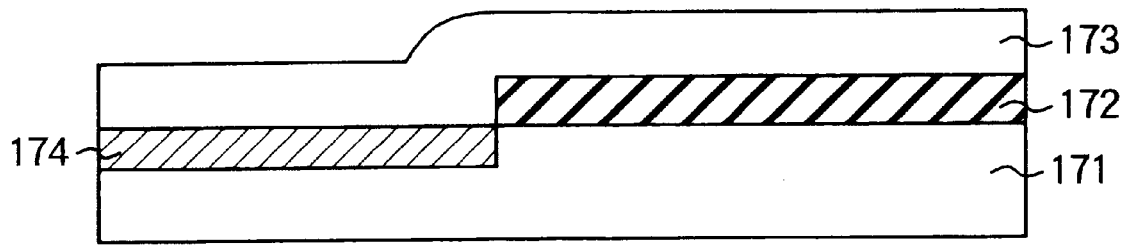
FIGS. 26A to 26C, FIGS. 27A to 27C, FIGS. 28A to 28C, and FIGS. 29A and 29B are cross-sectional views for assistance in explaining a second conventional method of manufacturing the conventional semiconductor device.
Figure 26B:
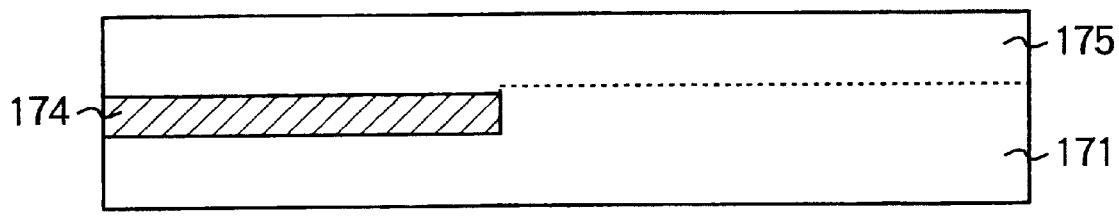
Figure 26C:
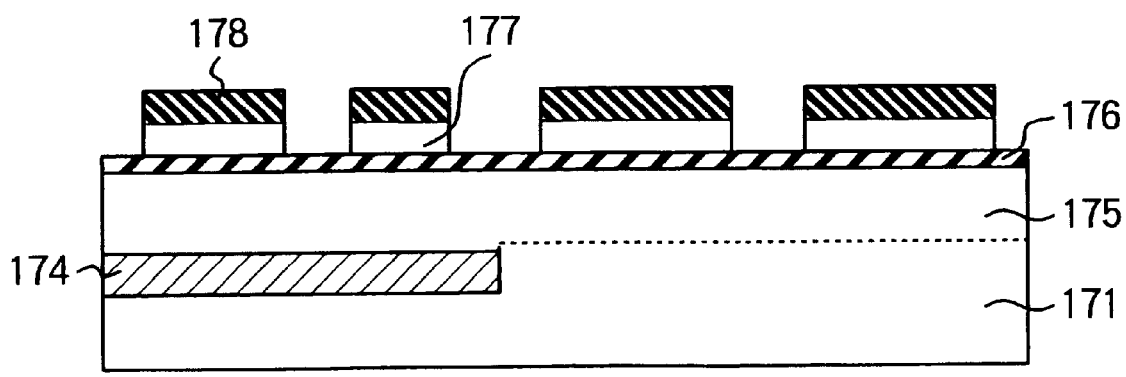
Figure 27A:
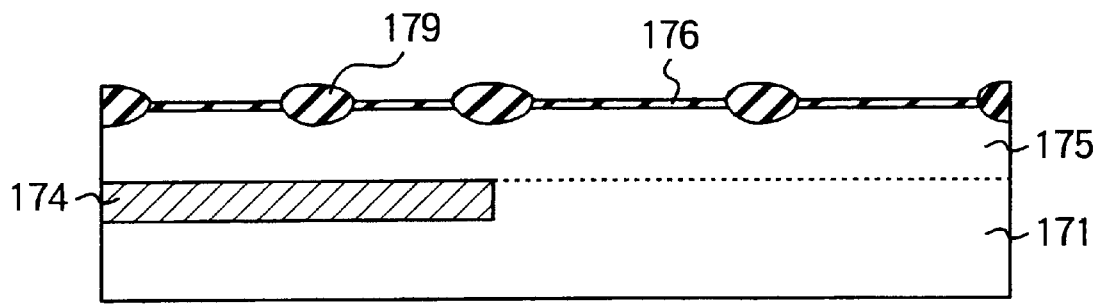
Figure 27B:
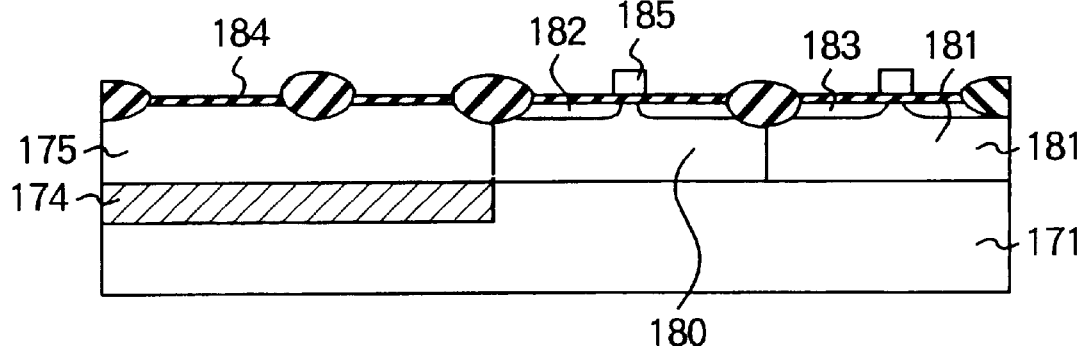
Figure 27C:
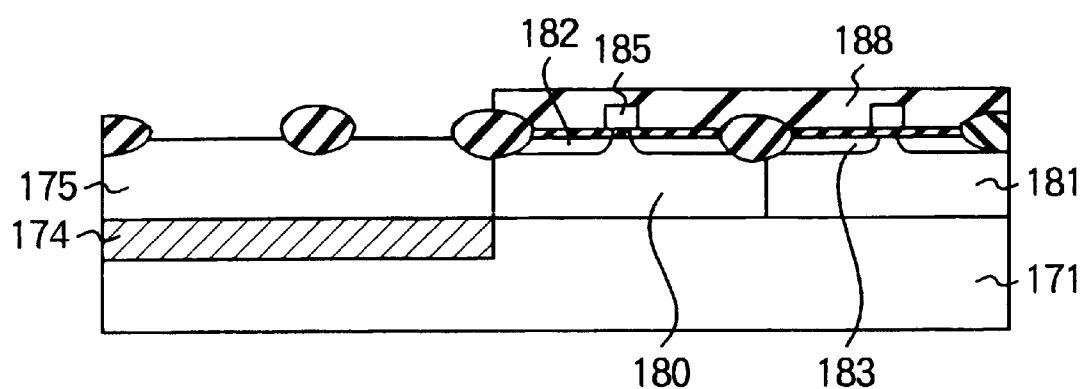
Figure 28A:
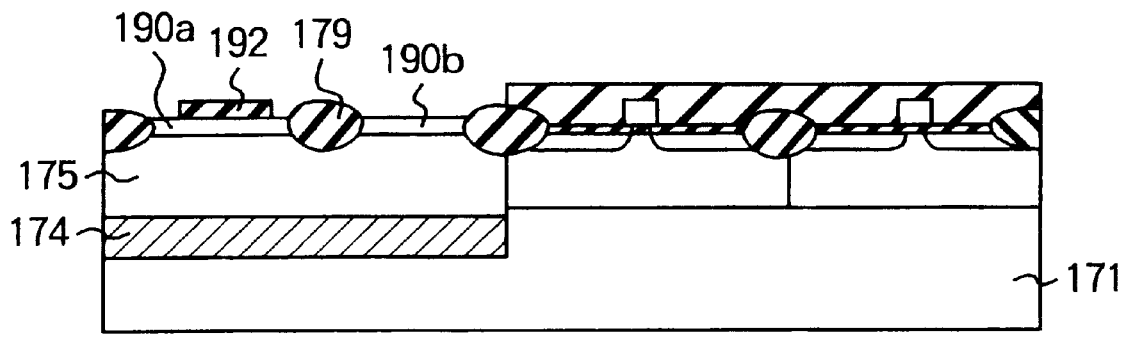
Figure 28B:
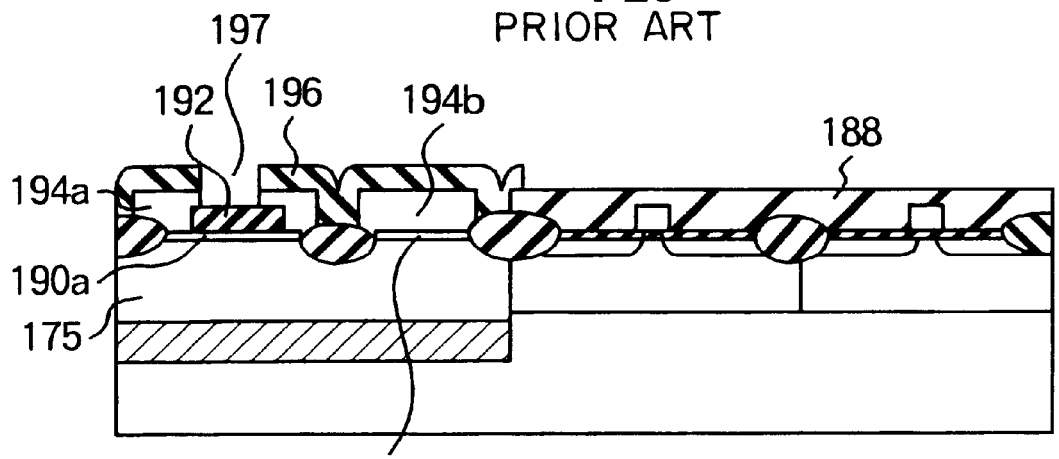
Figure 28C:
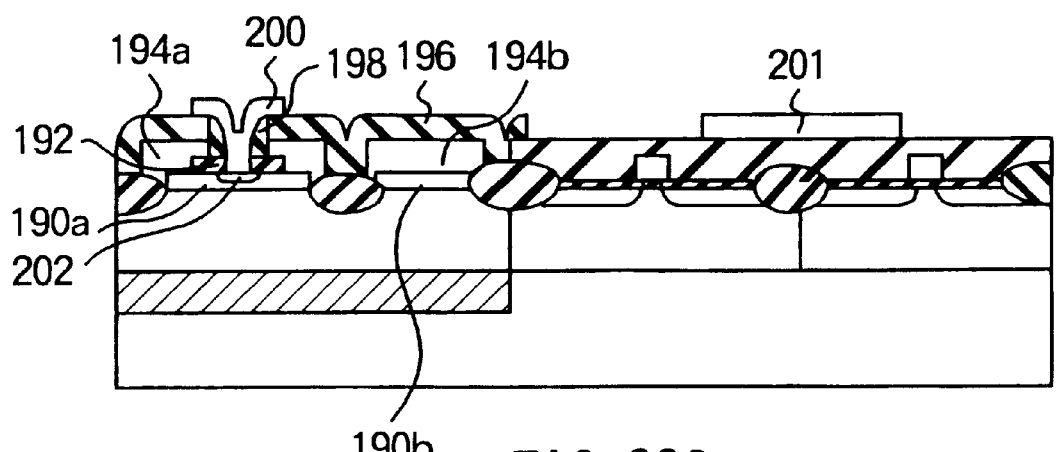
Figure 29A:
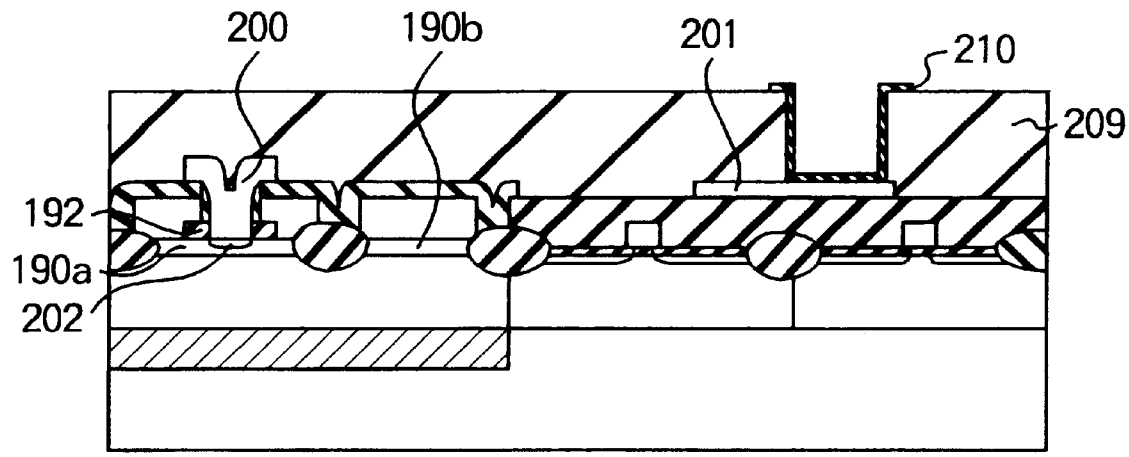
Figure 29B:
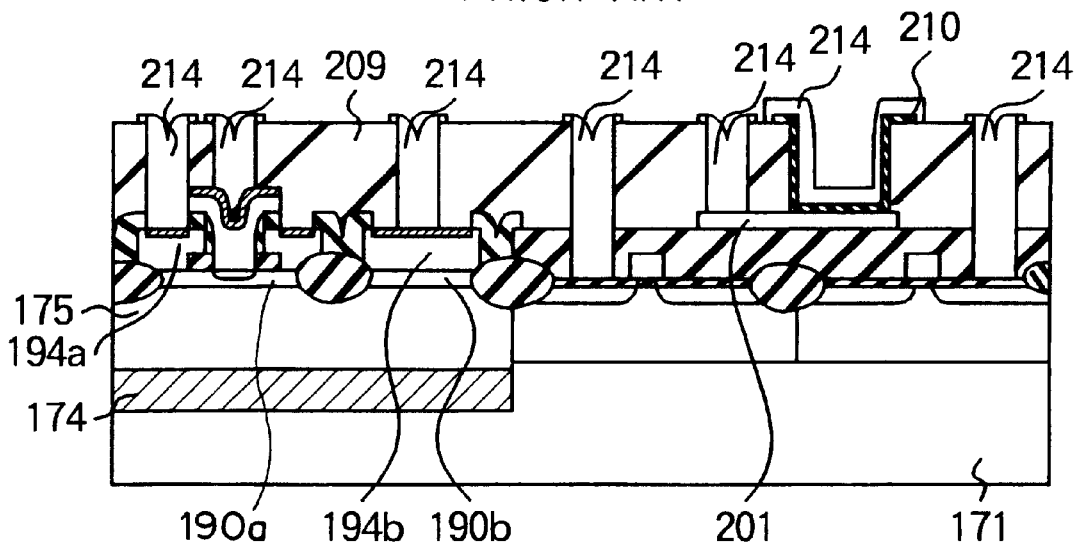
Figure 30:
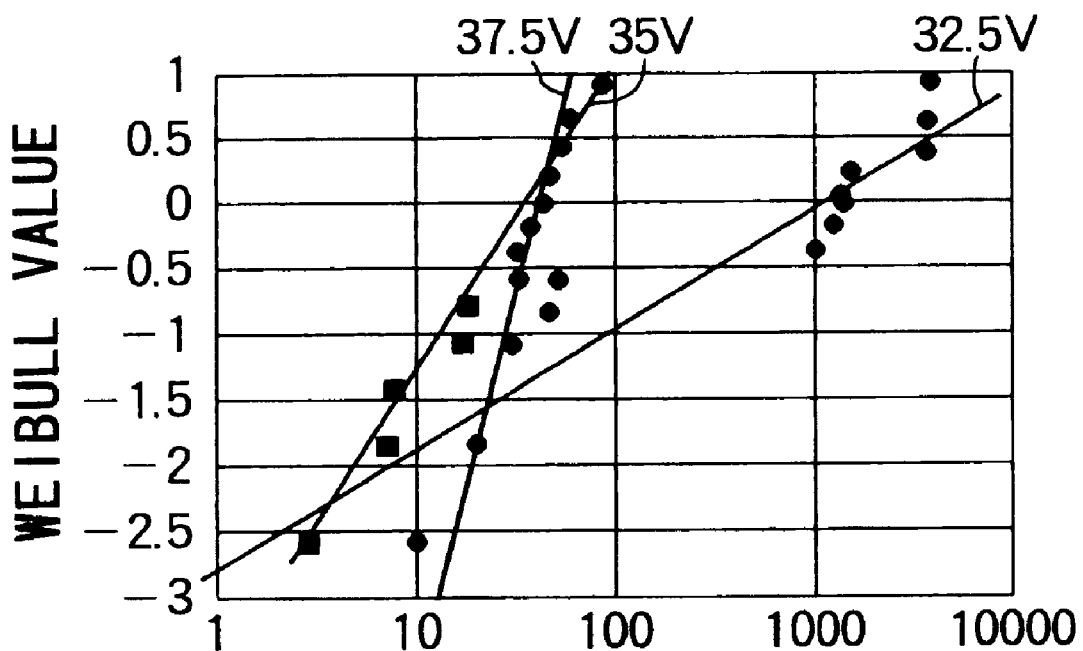
FIG. 30 is a graphical representation showing the TDDB test results of the conventional semiconductor device manufactured by the conventional method.

Further, as shown in FIG. 25B, after the interlayer insulating film 109 has been formed in the same way as with the case of the eighth embodiment to the step of forming the interlayer insulating film 109, a hole connected to the lower capacitor electrode 86 is formed in the interlayer insulating film 109 and the silicon oxide film 88. Further, a capacitor insulating film 110 of silicon nitride and a thin metal film 111 of TiN, for instance are deposited in sequence all over the surface of the substrate, and then patterned. The steps after this are the same as with the case of the eighth embodiment.

As described above, the eleventh embodiment of the manufacturing method according to the present invention provides the same effect as with the case of the eighth embodiment.

Further, in the embodiments of the manufacturing method for the semiconductor device according to the present invention, although the Ar sputtering has been used to remove the natural oxide film formed at the bottoms of the contact holes, instead it is possible to etch the substrate by the RIE method effected within $BCl_3$ gas. In this case, however, since Cl is contained in the surface of the silicide layer 105 formed at the bottoms of the contact holes, a Cl peak of a concentration of more than $10^{21}$ cm$^{-3}$ appears in the surface of the silicide layer 105 within the range from 100 to 300 Å deep away from the outermost surface of the silicide layer 105, in the same way as with the case of Ar.

As described above, in the method of manufacturing the semiconductor device according to the present invention, when the metal wiring film is formed, since the capacitor forming regions are covered with a metal film (e.g., Al), even if the sputtering is made prior to the formation of the metal wiring film, the capacitor insulating film will not be cut down, with the result that it is possible to increase the controllability of the capacitor capacitance and thereby to obtain a reliable capacitor.

What is claimed is:

1. A method of manufacturing a semiconductor device, comprising the steps of:

forming a first insulating film on a semiconductor substrate on which a lower capacitor electrode has been formed;

removing the first insulating film at a first region on the lower capacitor electrode, the first region corresponding to a capacitor forming region in which a capacitor is to be formed on the semiconductor device;

forming a second insulating film on the semiconductor substrate;

forming a conductive film on the formed second insulating film;

patterning the conductive film and the second insulating film, to leave both the films at least at the capacitor forming region;

thereafter, patterning the first insulating film, to form a contact hole with the lower capacitor electrode at a region other than the capacitor forming region; and dry etching the lower capacitor electrode, to remove a nature oxide film formed at a bottom of the contact hole.

2. A method of manufacturing a semiconductor device, comprising the steps of:

forming a first insulating film on a semiconductor substrate on which a lower capacitor electrode has been formed;

removing the first insulating film at a first region on the lower capacitor electrode, the first region corresponding to a capacitor forming region in which a capacitor is to be formed on the semiconductor device;

forming a second insulating film on the semiconductor substrate;

forming a conductive film on the formed second insulating film;

patterning the conductive film and the second insulating film, to leave both the films at least at the capacitor forming region;

thereafter, patterning the first insulating film, to form a contact hole with the lower capacitor electrode at a region other than the capacitor forming region; and dry etching the lower capacitor electrode, to remove a nature oxide film formed at a bottom of the contact hole;

wherein the step of forming the contact hole comprises the steps of:

before the contact hole is formed, forming a third insulating film all over a surface of the semiconductor substrate;

patterning the third insulating film, to form a contact hole with the conductive film; and patterning the third insulating film and the first insulating film, to form the contact hole with the lower capacitor electrode at a region other than the capacitor forming region.

3. The method of manufacturing a semiconductor device of claim 1, wherein the conductive film is any one of a metal film, a semiconductor film and a metal silicide film, and a laminated film of these films.

4. The method of manufacturing a semiconductor device of claim 1, wherein:

a bipolar transistor and a CMOSFET are both formed on the semiconductor substrate;

the lower capacitor electrode is formed on an insulating film so as to cover the CMOSFET; and a metal silicide film is formed on a surface of the lower capacitor electrode.

5. The method of manufacturing a semiconductor device of claim 4, wherein:

the bipolar transistor is formed with a collector region, a base region, an emitter region, a collector electrode connected to the collector region, a base electrode connected to the base region, and an emitter electrode connected to the emitter region;

the lower capacitor electrode is formed at the same time together with the emitter electrode; and a metal silicide layer is formed on each surface of the collector electrode, the base electrode and the emitter electrode.

6. The method of manufacturing a semiconductor device of claim 4, wherein:

the bipolar transistor is formed with a collector region, a base region, an emitter region, a collector electrode connected to the collector region, a base electrode connected to the base region, and an emitter electrode connected to the emitter region;

the lower capacitor electrode is formed at the same time together with the collector electrode and the base electrode; and a metal silicide layer is formed on each surface of the collector electrode, the base electrode and the emitter electrode.

7. The method of manufacturing a semiconductor device of claim 1, wherein:

a bipolar transistor, an NMOSFET and a PMOSFET are all formed on the semiconductor substrate; and the lower capacitor electrode is formed on an element separating insulating film existing between the NMOSFET and the PMOSFET, at the same time together with gate electrodes of the NMOSFET and the PMOSFET.

8. The method of manufacturing a semiconductor device of claim 1, wherein the dry etching is a sputtering using Ar gas or a reactive ion etching using $BCl_3$ gas.

* * * * *